United States Patent [19]

Gooch

[11] Patent Number: 5,119,255
[45] Date of Patent: Jun. 2, 1992

[54] MAGNETIC SATURATION CONTROLLED SCANNING MAGNETIC TRANSDUCER

[75] Inventor: Beverley R. Gooch, Sunnyvale, Calif.

[73] Assignee: Ampex Corporation, Redwood City, Calif.

[21] Appl. No.: 829,592

[22] Filed: Feb. 13, 1986

Related U.S. Application Data

[63] Continuation-in-part of Ser. No. 641,817, Aug. 16, 1984, abandoned.

[51] Int. Cl.[5] ............... G11B 5/245; G11B 5/127; G11B 5/17
[52] U.S. Cl. .................................. 360/115; 360/123; 360/125
[58] Field of Search ............... 360/115, 119, 120, 125, 360/128, 137, 55, 123

[56] References Cited

U.S. PATENT DOCUMENTS

| 3,079,468 | 2/1963 | Morey | 179/100.2 |
|---|---|---|---|
| 3,084,227 | 4/1963 | Peters | 179/100.2 |
| 3,106,617 | 10/1963 | Fox | 179/100.2 |
| 3,152,225 | 10/1964 | Peters | 179/100.2 |
| 3,175,049 | 3/1965 | Gabor | 179/100.2 |
| 3,188,399 | 6/1965 | Eldridge | 179/100.2 |
| 3,255,307 | 6/1966 | Schuller | 178/6.6 |
| 3,314,056 | 4/1967 | Lawrence | 340/174.1 |
| 3,382,325 | 5/1968 | Camras | 179/100.2 |
| 3,391,254 | 7/1968 | Honig | 179/100.2 |
| 3,435,440 | 3/1968 | Nallin | 340/174.1 |
| 3,555,204 | 1/1968 | Braun | 179/100.2 |
| 3,573,844 | 6/1968 | Gardner | 179/100.2 |
| 3,696,216 | 10/1972 | Sugaya et al. | 179/100.2 C |
| 3,845,503 | 10/1974 | Kanai | 360/115 |
| 3,893,187 | 7/1975 | Kanai et al. | 360/115 |
| 4,318,136 | 3/1982 | Jeffers | 360/17 |
| 4,322,763 | 3/1982 | Lemke | 360/115 |
| 4,530,016 | 7/1985 | Sawazaki | 360/55 |
| 4,535,369 | 8/1985 | Sawazaki | 360/55 |

FOREIGN PATENT DOCUMENTS

1065876 1/1984 U.S.S.R.

Primary Examiner—Robert S. Tupper
Attorney, Agent, or Firm—Elizabeth E. Strnad; James A. LaBarre; C. Michael Zimmerman

[57] ABSTRACT

An electromagnetically controlled scanning magnetic transducer has two magnetic core portions with confronting poles defining a transducing gap. A control winding is arranged in each core portion to provide a control flux therein. The control flux saturates a region of the transducer face of each core portion, adjacent to the gap. The saturated regions define adjacent unsaturated highly permeable regions which overlap at the gap to obtain a transducing zone. The transducing zone can be altered, moved, scanned or otherwise positioned along the transducer width by electromagnetically controlling the location and size of the saturated face regions.

48 Claims, 14 Drawing Sheets

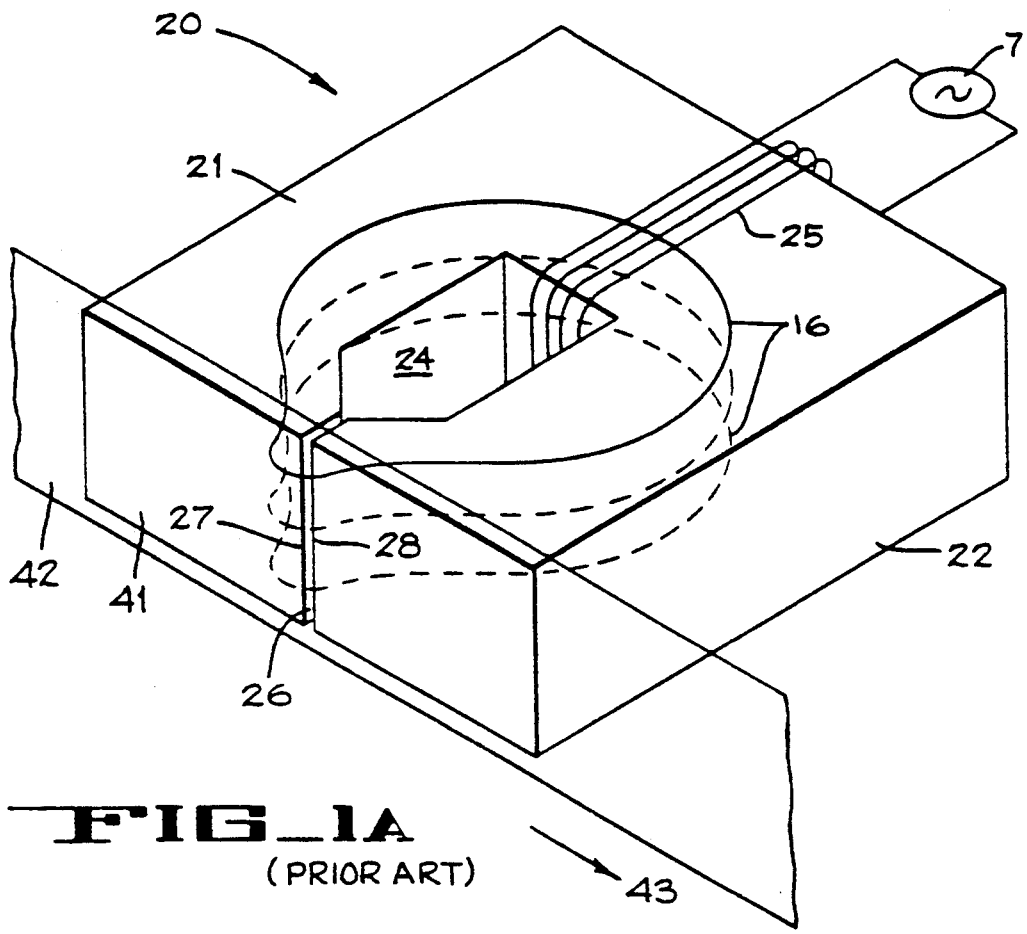
FIG_1A
(PRIOR ART)
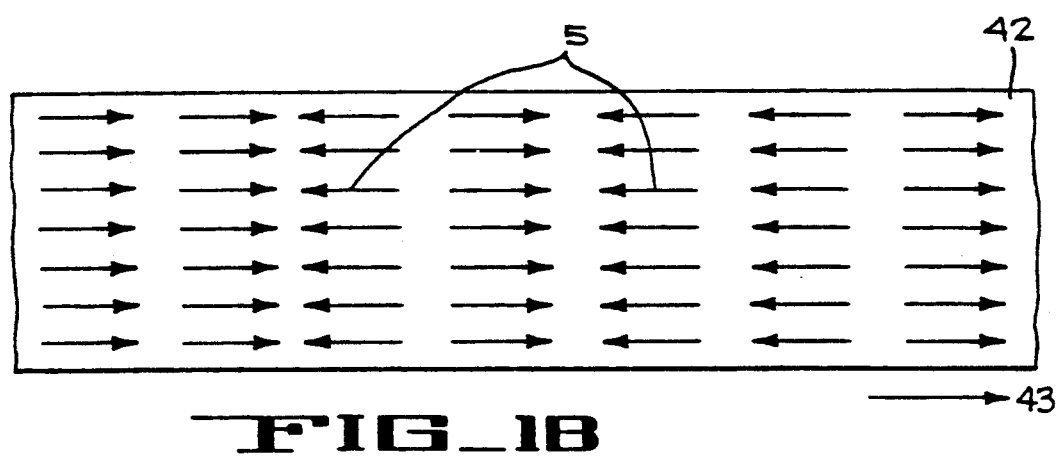
FIG_1B

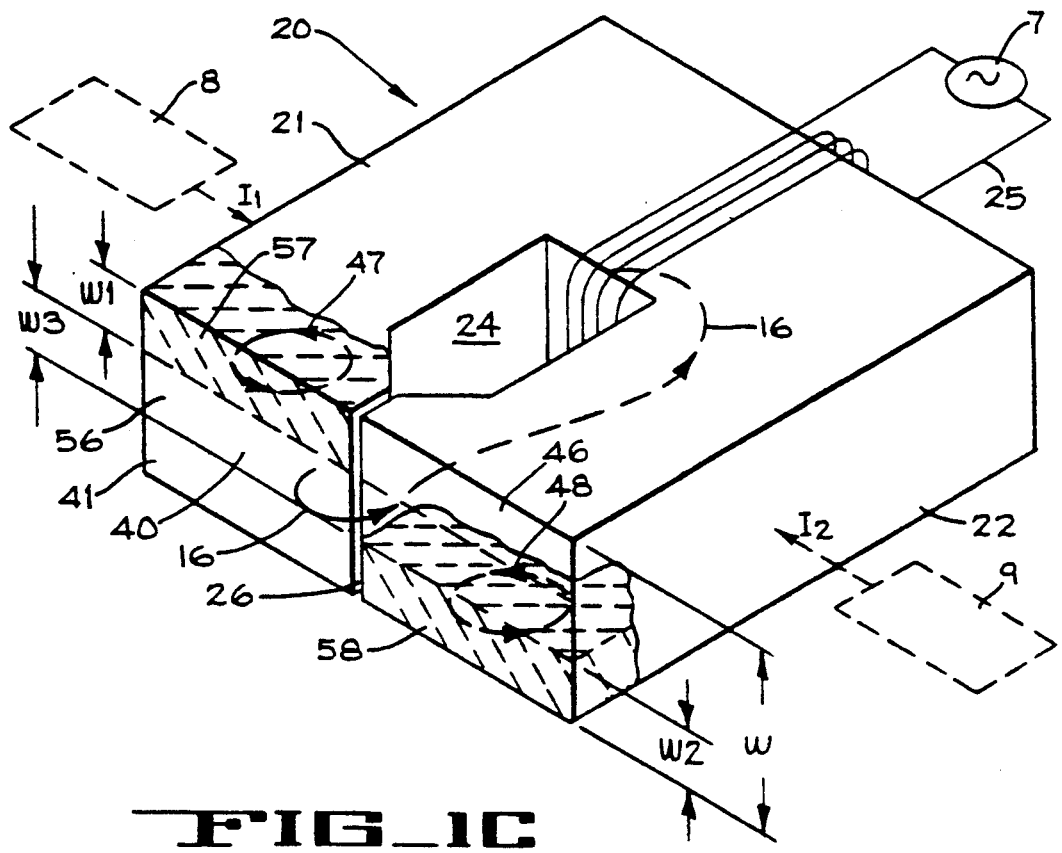
FIG_1C
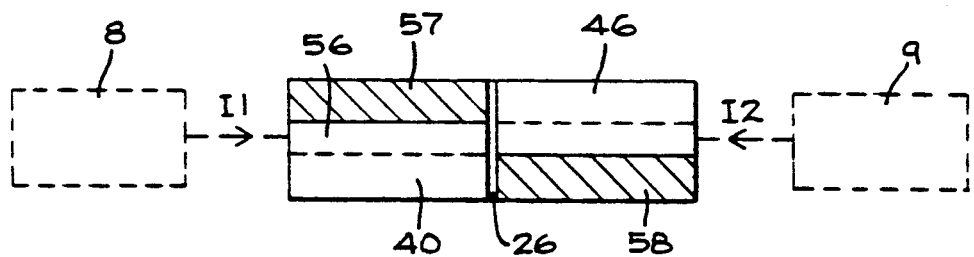
FIG_1D

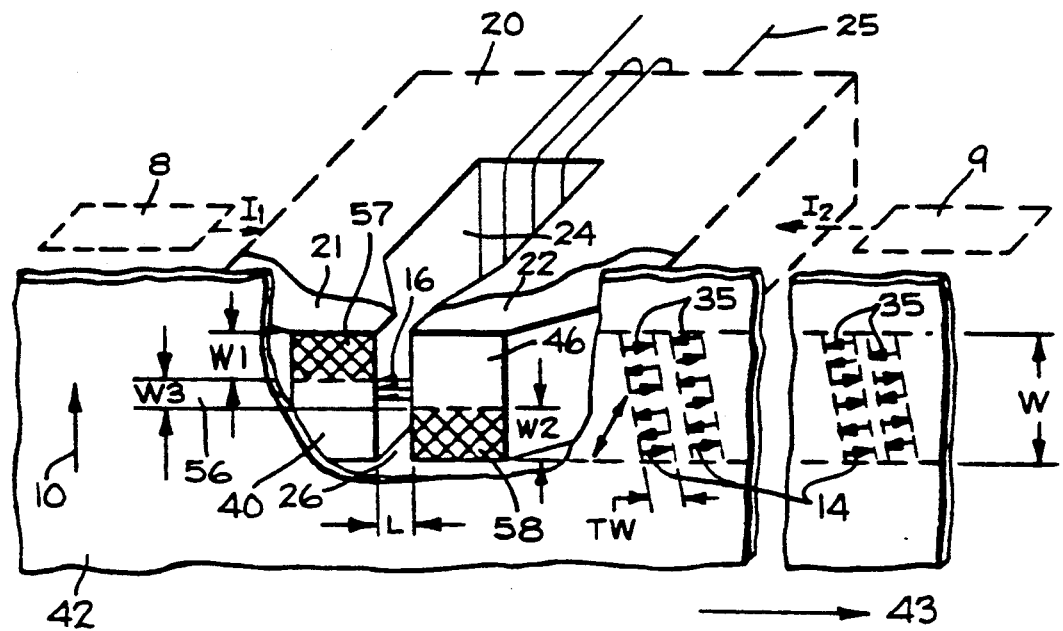
FIG_1E
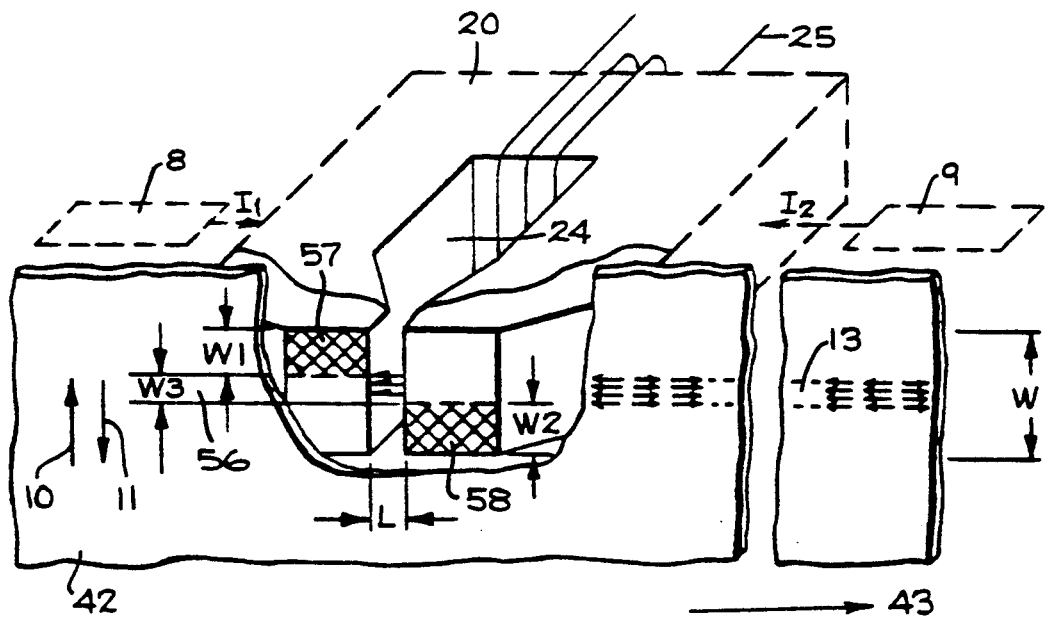
FIG_1F

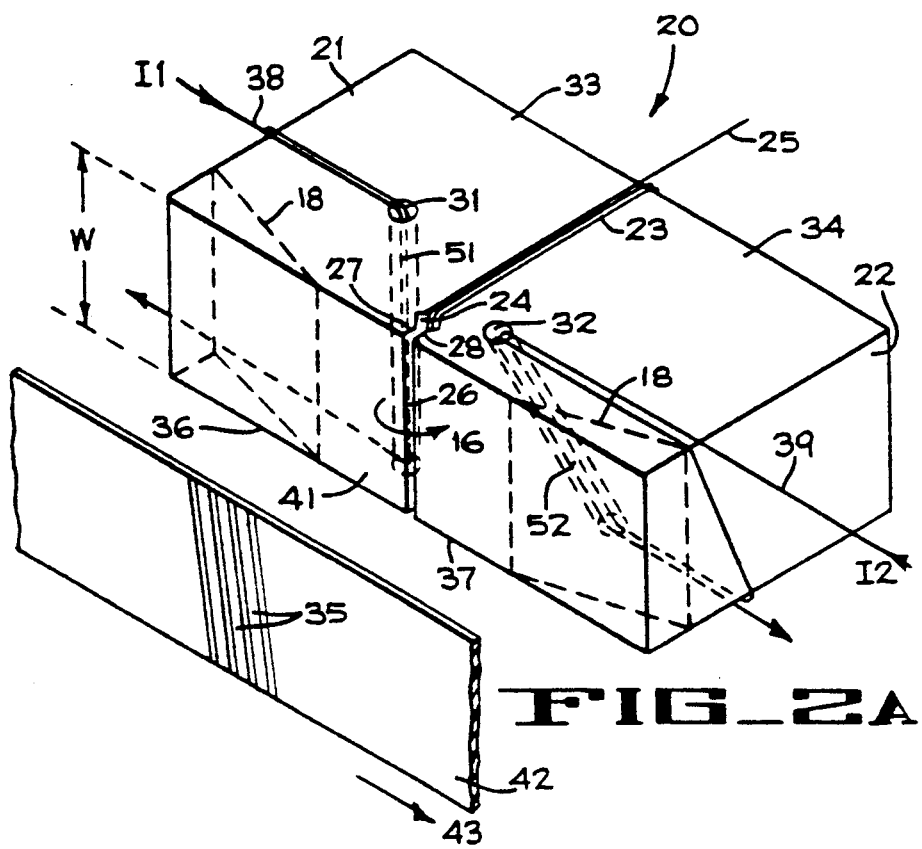
FIG_2A
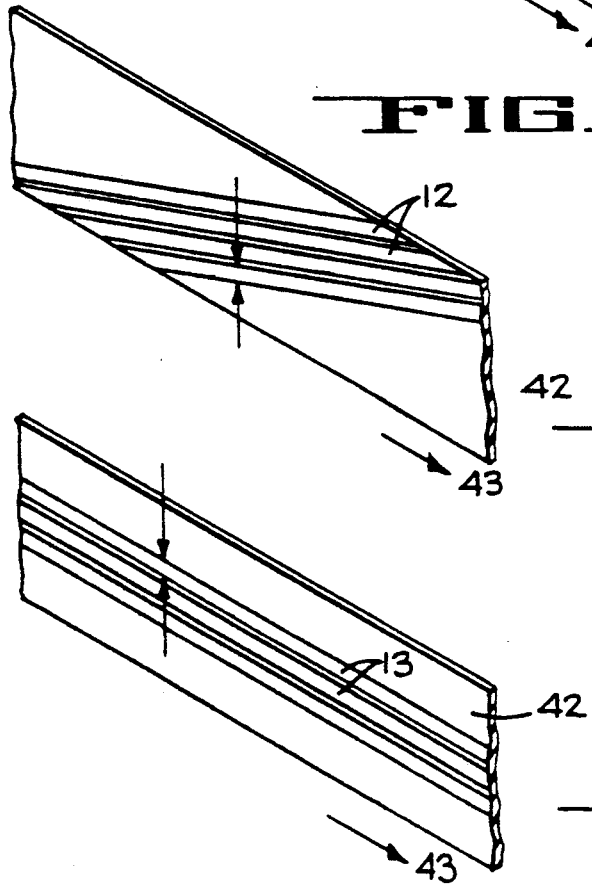
FIG_2B
FIG_2C
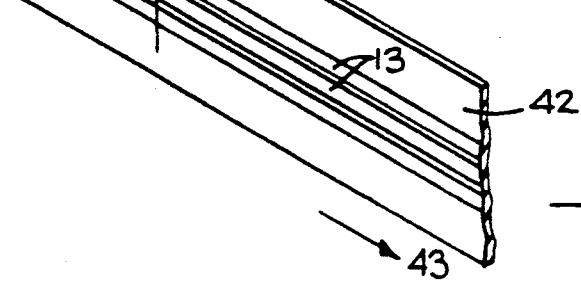
FIG_2D

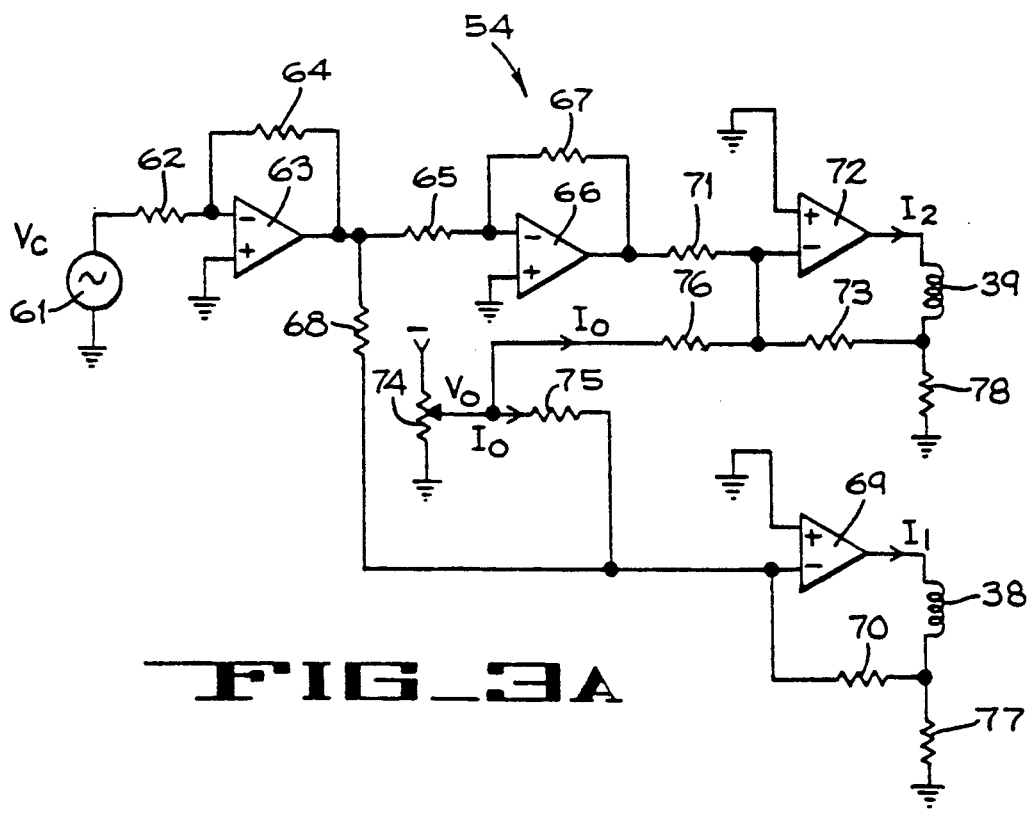
FIG_3A
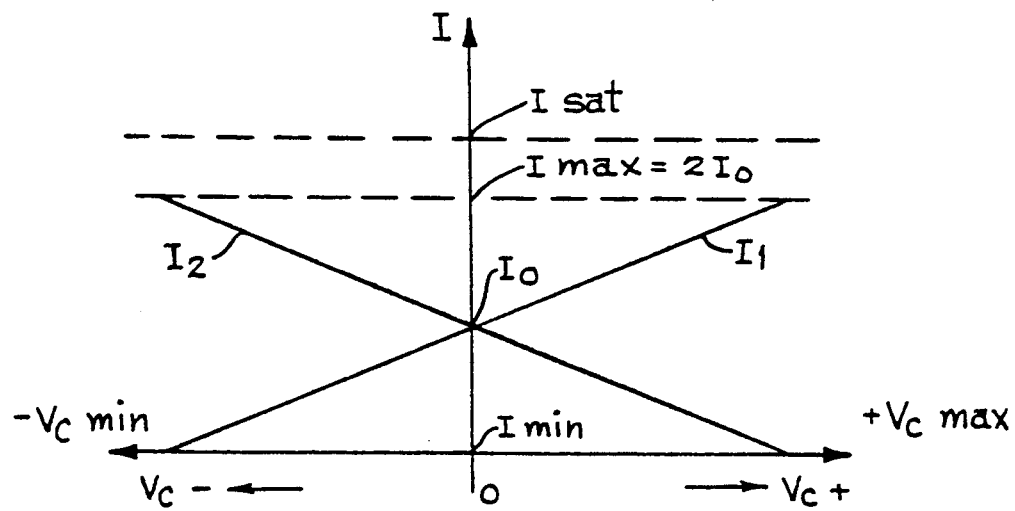
FIG_3B

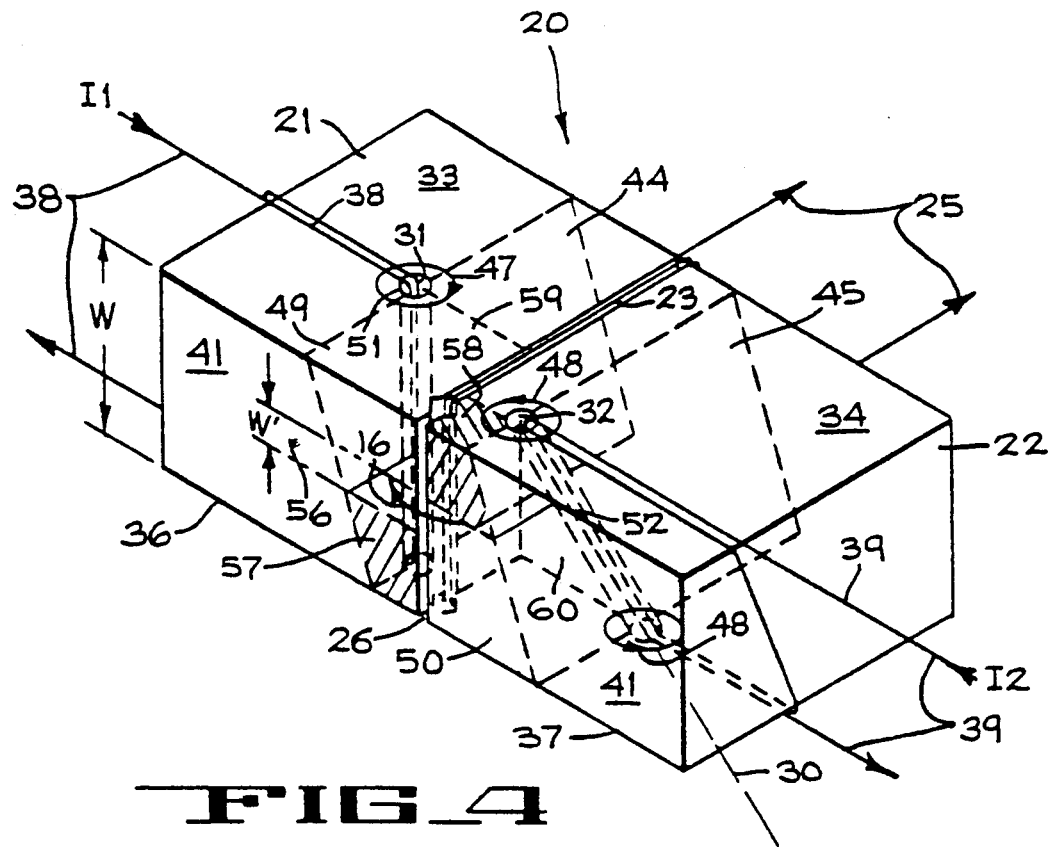
FIG_4
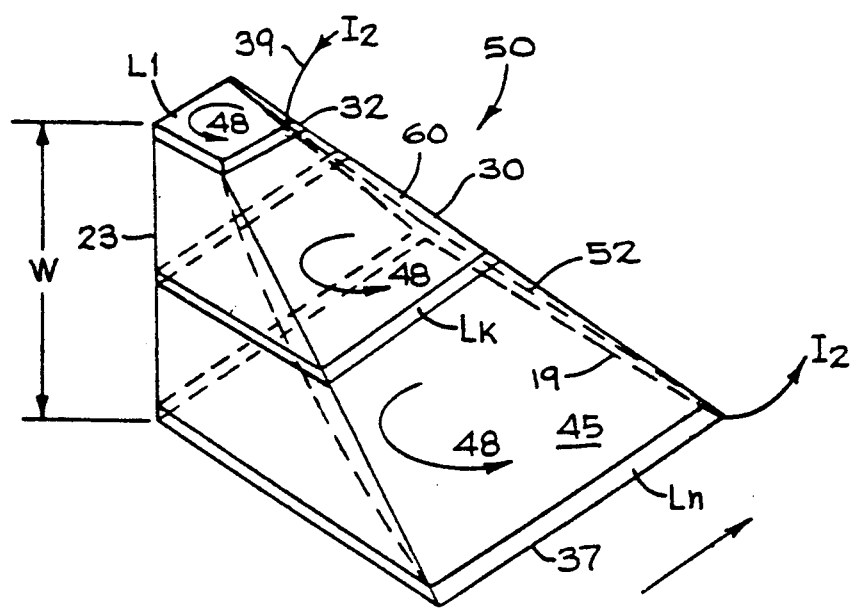
FIG_5

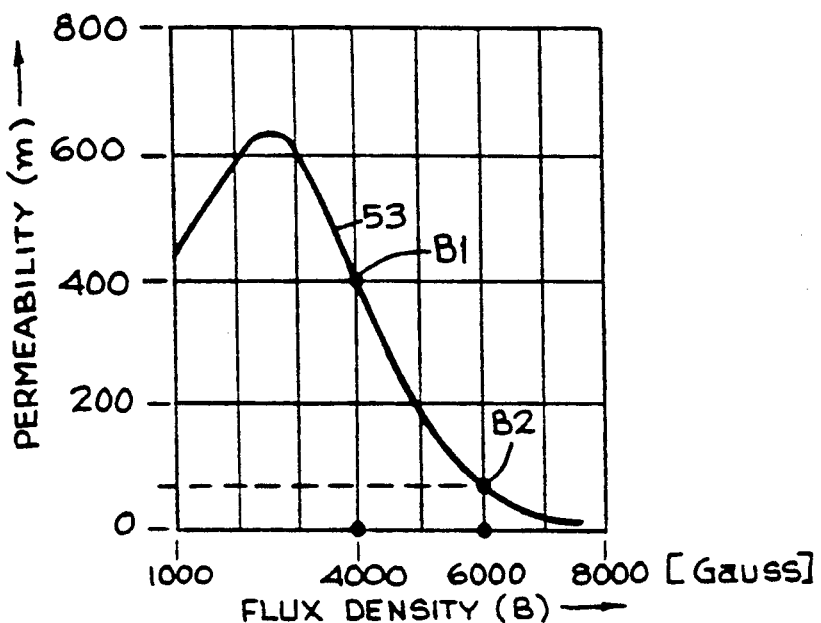
FIG_6
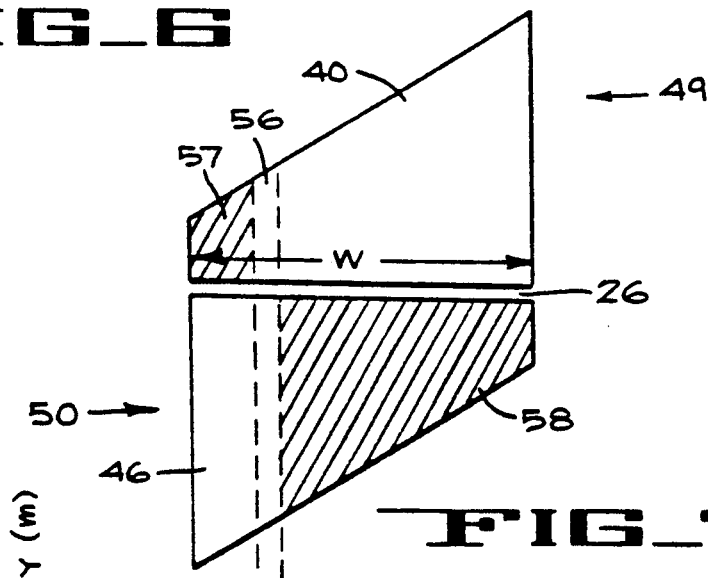
FIG_7A
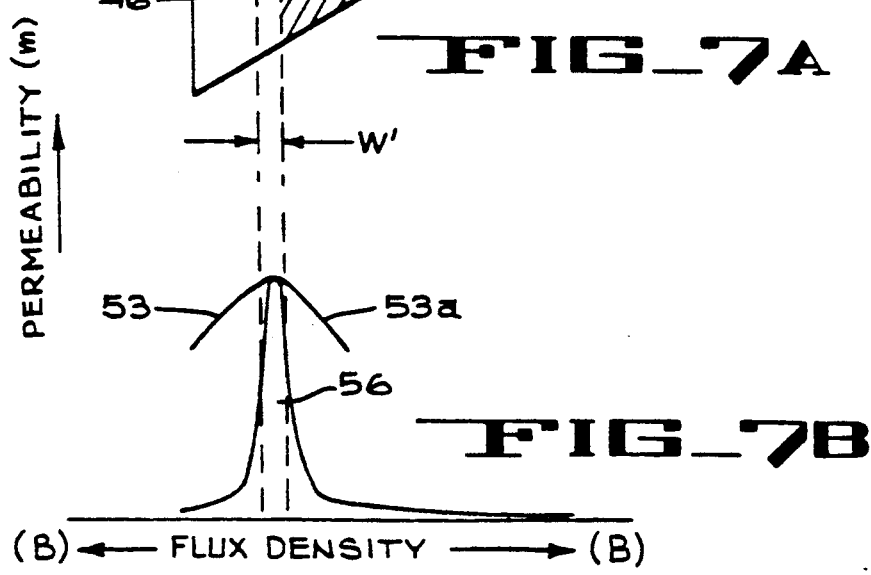
FIG_7B

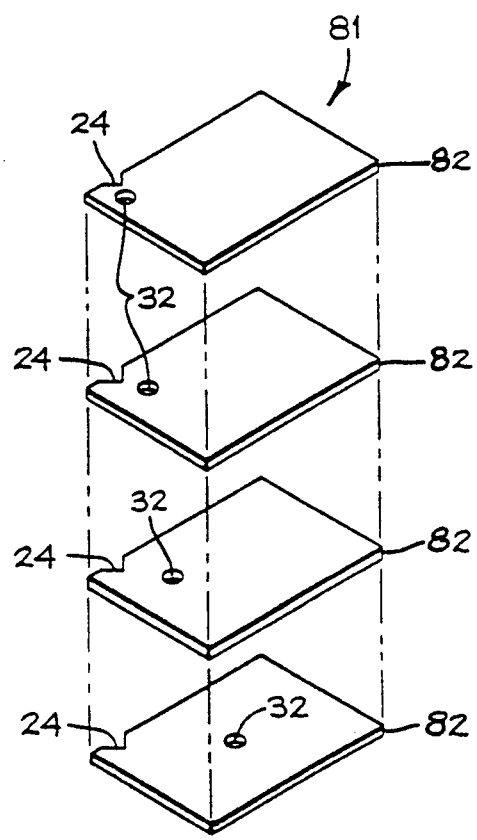
FIG_8
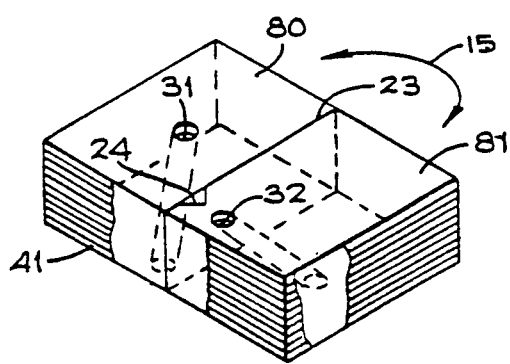
FIG_10
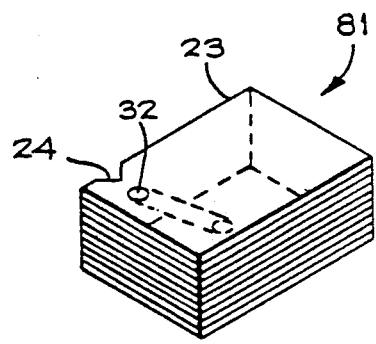
FIG_9
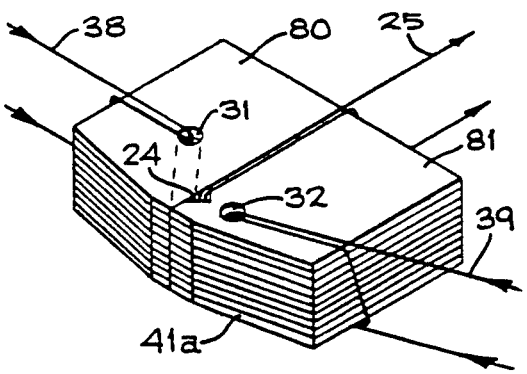
FIG_11

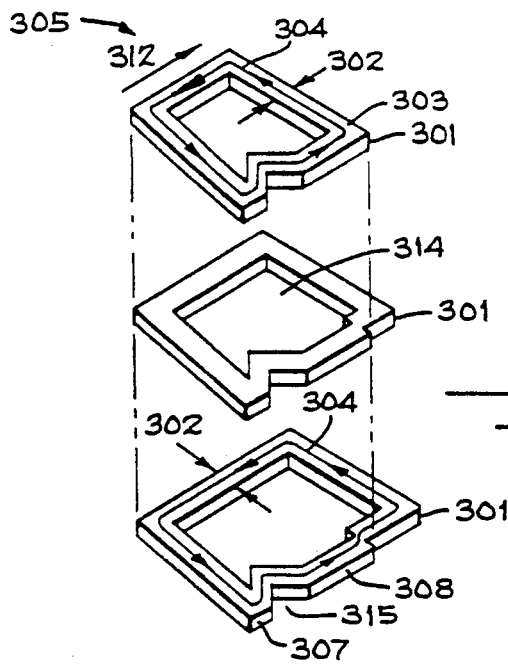
FIG_12
FIG_13
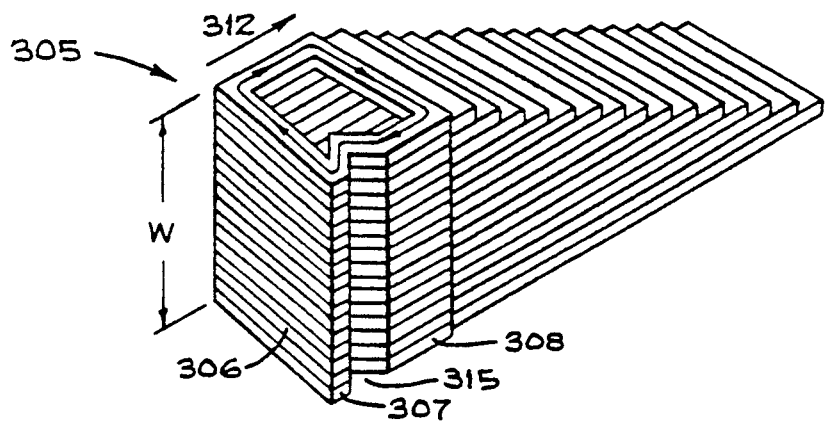
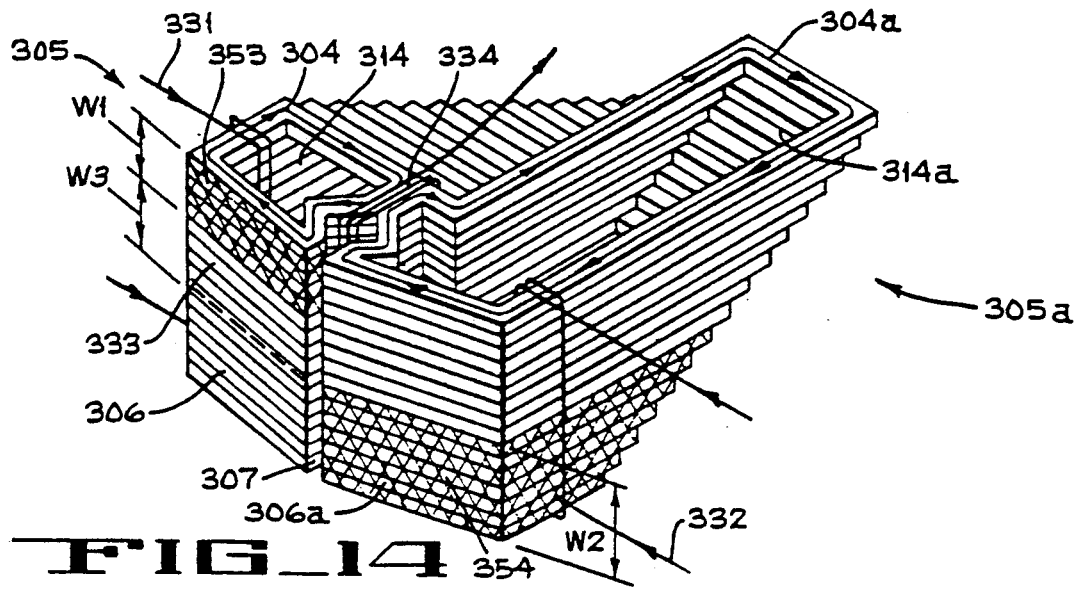
FIG_14

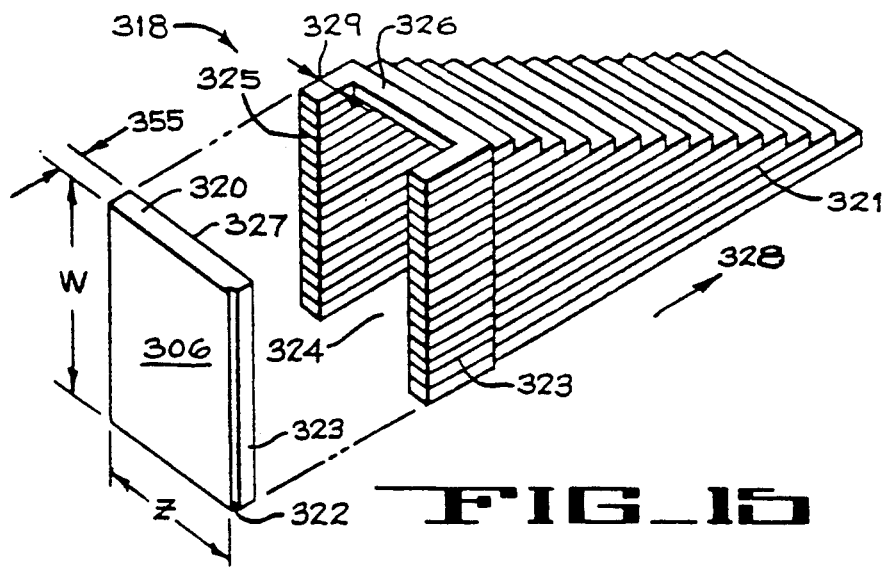
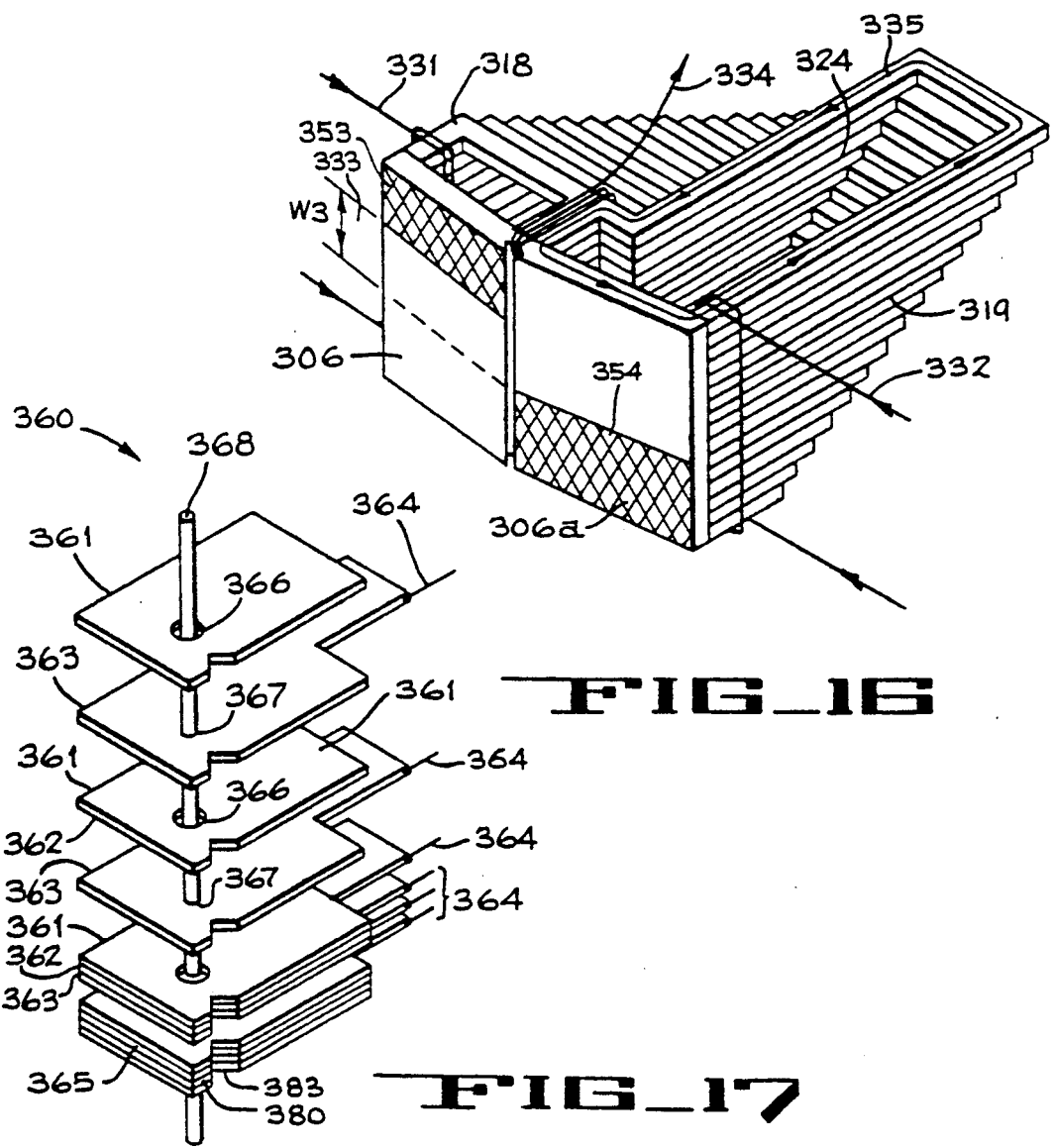

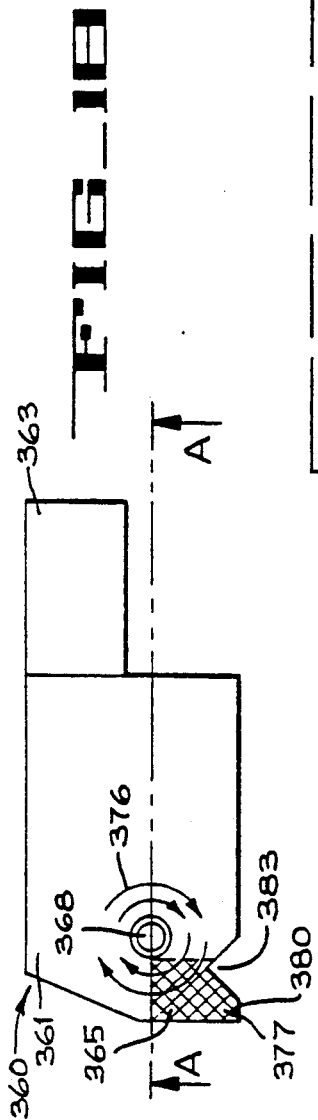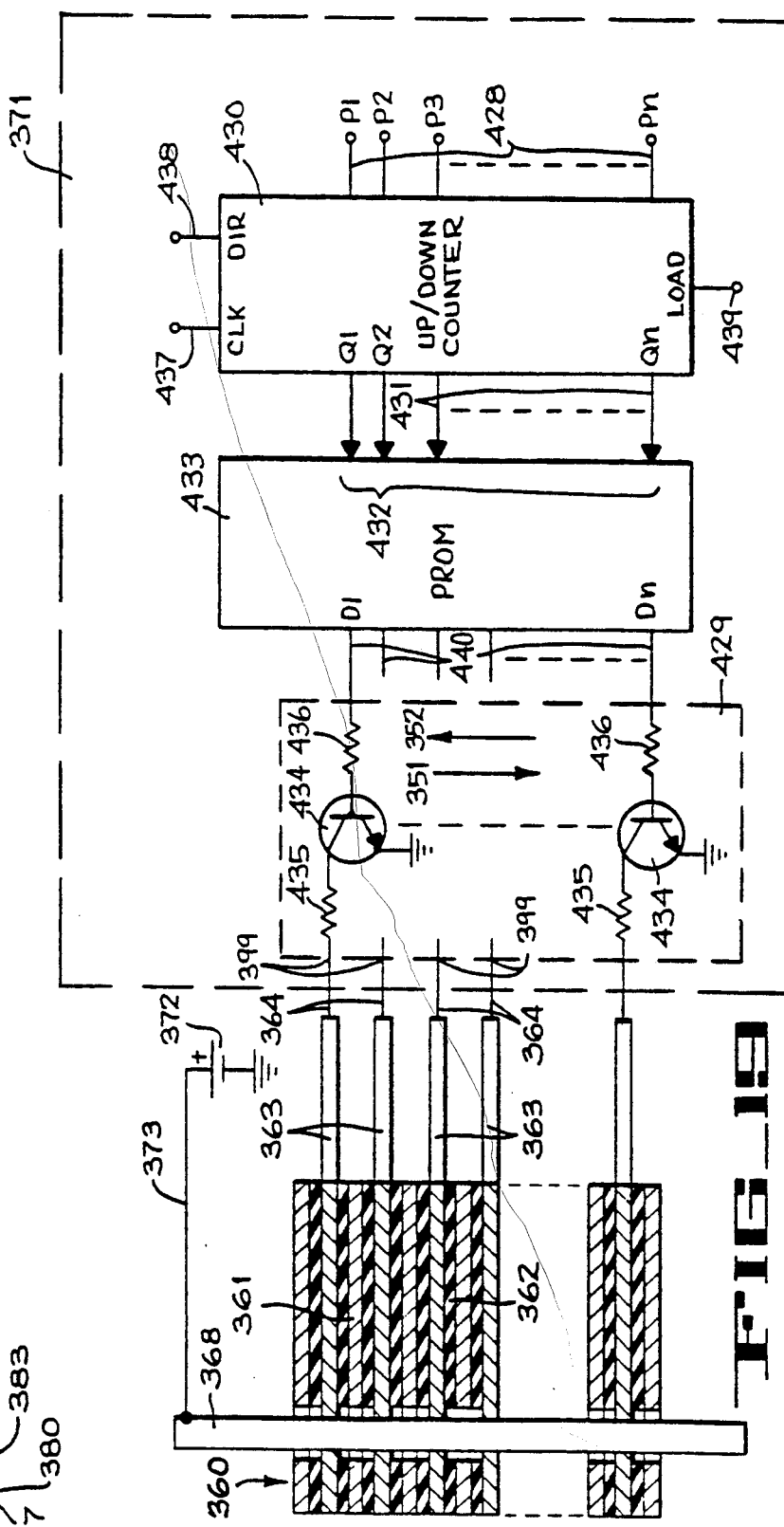

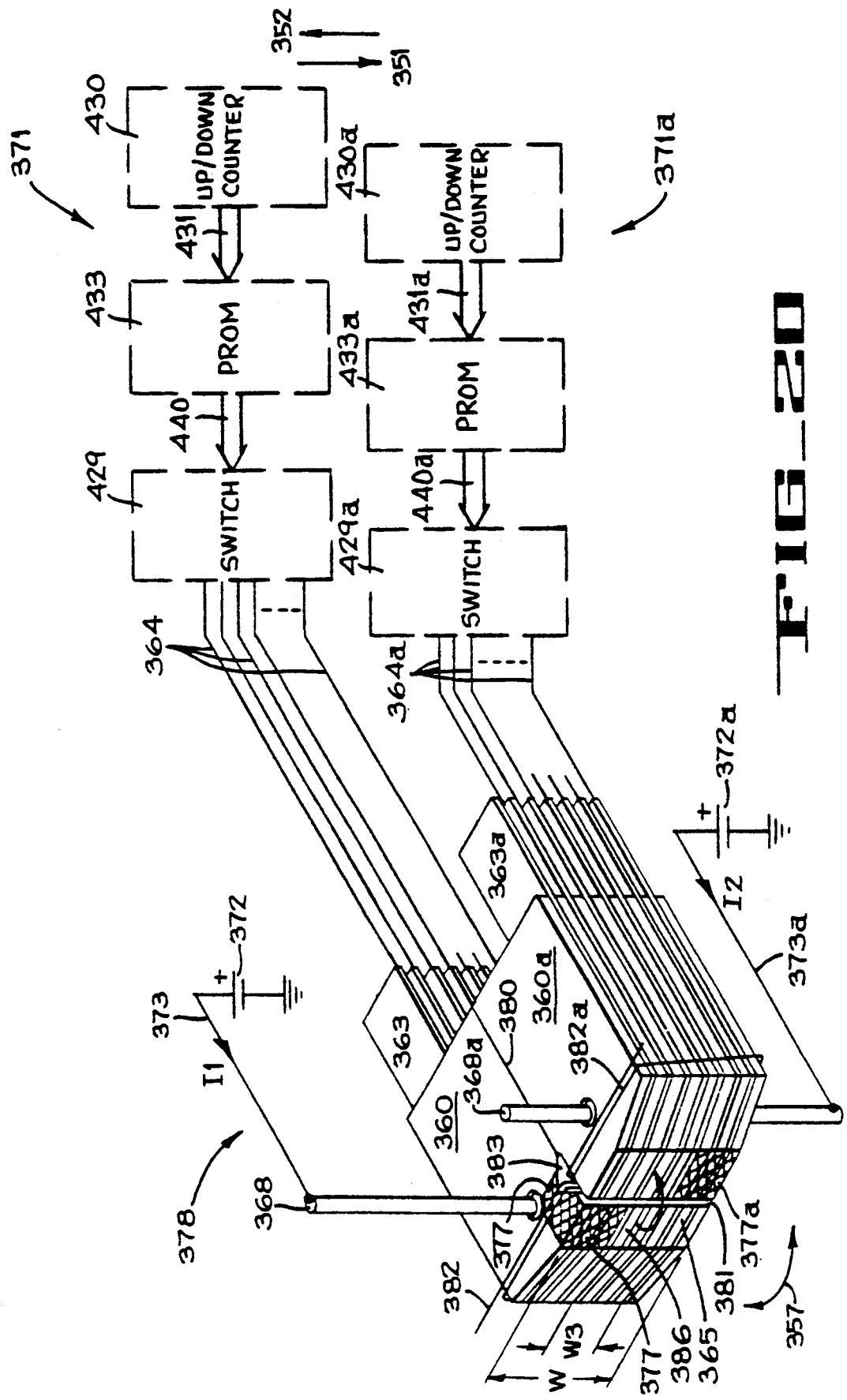

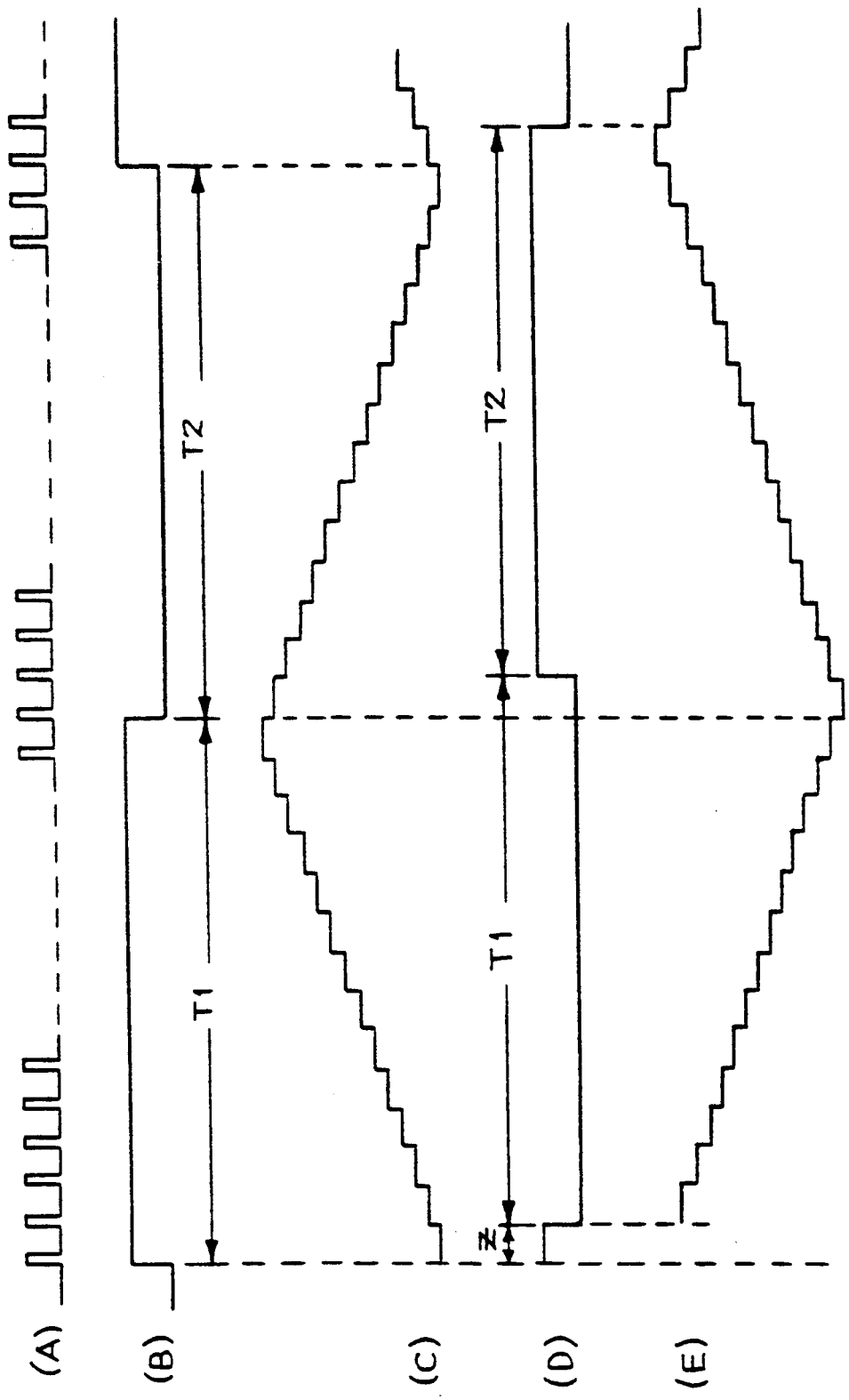
FIG_21

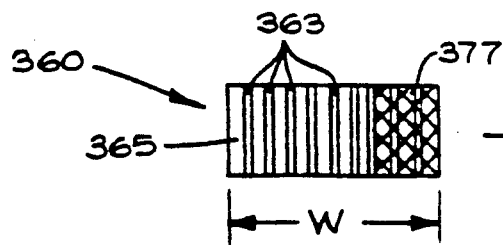
FIG_22
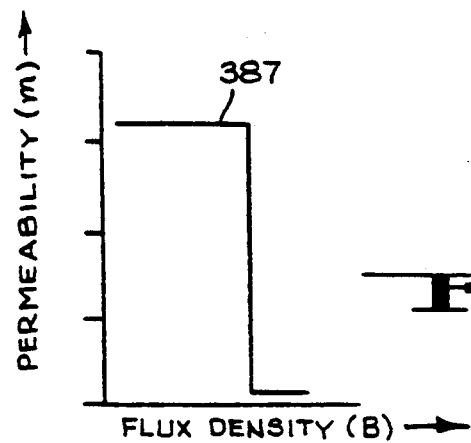
FIG_23
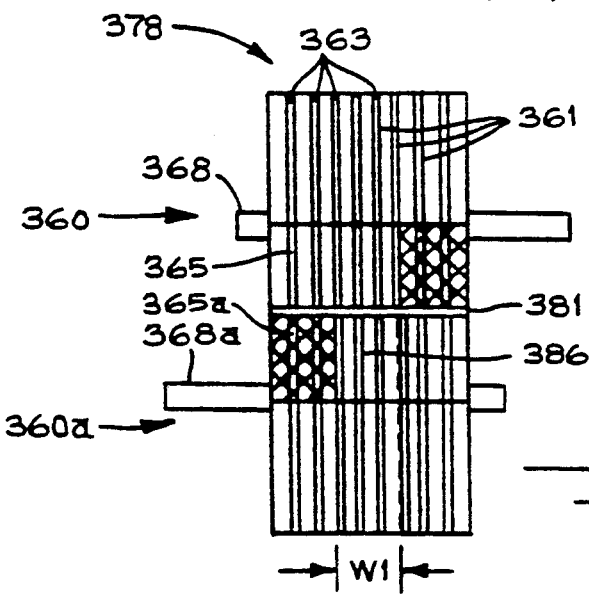
FIG_24
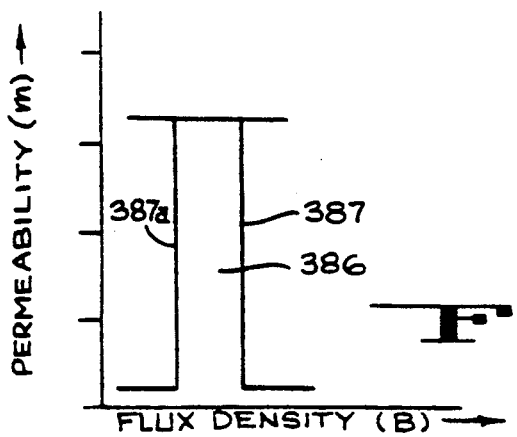
FIG_25

MAGNETIC SATURATION CONTROLLED SCANNING MAGNETIC TRANSDUCER

CROSS-REFERENCE TO RELATED APPLICATION

This is a continuation-in-part of my co-pending application Ser. No. 641,817, now abandoned, filed Aug. 16, 1984 and having a common assignee herewith.

BACKGROUND OF THE INVENTION

This invention relates to electromagnetically controlled scanning magnetic transducers wherein the location of a recording/reproducing zone within the transducer is controlled by electromagnetic rather than mechanical means. It more particularly relates to assuring that stray flux is not picked up by such a transducer from a record medium.

In wideband magnetic signal recording, great emphasis is placed on obtaining a high relative transducer-to-record medium speed. One obvious way to increase the relative speed is to increase the speed of the record medium. However, as a practical matter only a limited increase in speed of the medium can be made, since medium consumption is directly related to its speed and there are mechanical limitations associated with high speed medium transport.

The development of rotary head transducers, now utilized in magnetic tape recorders, represents a significant advance in increasing the relative head-to-tape speed. Here, the transducer rotates at high speed in contact with a relatively slowly advancing magnetic tape providing the medium. Depending on the angle at which the transducer sweeps the tape, there are two basic types of rotary scan recorders in common use, which are generally referred to as transverse and helical scan recorders. There are many problems associated with obtaining a desired accuracy and reproducibility of the signal recorded by rotary head recorders. For example, it is necessary to maintain very small mechanical tolerances between the rotating transducer-carrying drum, the transducer structure and the location of the transducer within the drum. At the same time, it is necessary to accurately maintain the rotational speed of the drum carrying the transducer with respect to the speed at which the tape is transported past the rotating transducer.

In magnetic recorders utilizing electromagnetically controlled scanning transducers, the disadvantages associated with mechanically moving the transducers are eliminated. Here the transducers are stationary and the high scanning speed is obtained by electromagnetically scanning the signal to be transduced across the width of the transducer and thereby across the record medium.

One known electromagnetically controlled scanning magnetic transducer has stacked magnetic laminations separated from one another by nonmagnetic spacers. Each lamination provides a closed magnetic circuit comprising a transducing gap. The stacked laminations have leg portions of controlled width gradually increasing in opposite directions on opposite sides of the transducer, which leg portions are linked by control windings. The scanning operation is obtained by saturating the leg portions on opposite sides of the transducer so that only one lamination at a time remains unsaturated and capable of transmitting transducing flux. The location of the transducing lamination is controlled by control currents applied to the control windings.

In this type of prior art transducer, scanning is obtained by sequentially interrupting the magnetic circuit of each lamination, thereby interrupting the transducing flux path provided by each. The controlled width leg portions, and resulting interruption zones, are at distant locations from the transducing gap and transducer face. Consequently, the unsaturated portions of such laminations facing a recording medium are susceptible to picking up crosstalk from an active (saturated) lamination or stray flux from recorded signal tracks on the medium. These picked-up signals may then be re-recorded on the medium or, at playback, they may leak into the magnetic circuit of the active element and cause degradation of the playback signal provided thereby. It will be appreciated that these disadvantages become more significant with increased frequency and density of recording.

It is a further disadvantage of these prior art transducers that, in order to reduce crosstalk between the laminations, each magnetic lamination of the stack is physically and magnetically separated from adjacent laminations. Therefore, only an incremental scanning motion across the medium is possible, and this is obtained by sequentially switching on/off the magnetic circuits of adjacent laminations, that is, scanning in a discrete step-like manner, rather than in a continuous manner. Also, track widths thus must not be less than the width of a single lamination and is adjustable only to integral multiples of this width. This is a disadvantage particularly in high frequency wideband recording/reproduction on narrow tracks where continuous scanning and accurate positioning of the transducing element over a narrow track are required for high quality performance.

SUMMARY OF THE INVENTION

These disadvantages are overcome by the instant invention, incorporated in a scanning transducer for transferring information to or from a magnetic record medium. The transducer includes, as is common, a pair of core portions which define a transducing gap providing a transducing zone for magnetically coupling the transducer to a record medium. Each of the core portions defines a transducer face portion through which transducing flux bearing information to be transferred flows to or from the record medium. As a particularly salient feature of the invention, control means are included for selectively saturating a first region of the face of each core while retaining a second region thereof magnetically unsaturated for the flow of transducing flux. At least a part of each of the second regions is opposite a corresponding part of the other to provide both entry and exit of transducing flux.

It will be recognized from the above that the portions of the faces at the transducing gap which at any given time are not being utilized for transducing flux are saturated. The result is that cross-talk and other stray flux cannot be picked up by the transducer. Thus, one need not be concerned about leakage within the transducer body itself—there simply is no stray flux to leak.

The invention further includes a method of utilizing the face regions in a magnetic transducer in the manner set forth above.

The invention does not require the use of discretely operating separate magnetic laminations. Thus, in embodiments incorporating the invention, the location of the highly permeable transducing zone can be continuously controlled along the width of the transducer by the magnetic saturation control means. Moreover, in these embodiments any desired transducing zone width can be obtained—this width is not limited to discrete widths governed by the widths of one or more independent laminations.

In a preferred embodiment of the invention, the above-mentioned first and second regions are obtained by selecting a transducer core material which will provide a steep permeability versus flux density gradient and by arranging in each core portion a control winding which is angularly displaced with respect to both the transducer face and a plane containing the transducing gap. A saturable core portion in the form of a wedge section is thereby defined, including a volume between the transducer face and transducing gap plane. The wedge sections in the core portions are oppositely oriented with respect to one another such that their cross-sectional areas perpendicular to the transducer face and the transducing gap plane increase in opposite directions on each side of the transducing gap plane. The cross-sectional areas, including the face of each core, are selectively saturated by applying respective control currents to the control windings. The saturated cross-sectional areas of each core define therebetween, an unsaturated highly permeable transducing zone which extends across the transducing gap at the transducer face.

In a further preferred embodiment of the invention, the desired face regions are obtained by providing control flux paths in the core portions of a substantially constant cross section and gradually increasing lengths in opposite directions across the width of each core portion.

Alternative embodiments of the invention include a laminated core structure comprising a plurality of magnetic laminations separated from one another by electrically conductive laminations. An electrically conductive drive line extends through each core portion at a selected distance from the transducer face and transducing gap plane. Portions of the drive line are connected to the conductive laminations. Control currents are differentially switched into these portions of the drive line to saturate portions of selected magnetic laminations at the transducer face adjoining the transducing gap. While these alternative embodiments (as controlled) provide discrete widths, they provide saturation at the transducer face and thus substantially eliminate the pick-up by the transducer of flux caused by the presence of the record medium.

BRIEF DESCRIPTION OF THE DRAWINGS

FIG. 1A is a schematic perspective view of a prior art magnetic transducer without the magnetic saturation controlled scanning that characterizes the present invention.

FIG. 1B shows orientation of magnetic particles on a tape as recorded by the transducer of FIG. 1A.

FIG. 1C is a schematic perspective view illustrating the operation principle of an electromagnetically controlled scanning magnetic transducer in accordance with the present invention.

FIG. 1D is a front elevation view of the transducer of FIG. 1C.

FIGS. 1E and 1F show various operating modes of the transducer of FIG. 1C.

FIG. 2A is a simplified perspective view of an electromagnetically controlled scanning magnetic transducer in accordance with a preferred embodiment of the invention.

FIGS. 2B to 2D respectively show various forms of recording which can be obtained when utilizing a transducer in accordance with the present invention.

FIG. 3A is a schematic diagram of a control circuit utilized to drive the transducer of the FIG. 2A embodiment of the invention.

FIG. 3B is a control voltage versus control current characteristic obtained by the circuit of FIG. 3A.

FIG. 4 is a more detailed representation of the transducer shown in FIG. 2A.

FIG. 5 is an enlarged perspective view of a saturable wedge section of the transducer of FIG. 4.

FIG. 6 is an example of a flux density versus permeability characteristic of a well known magnetic material.

FIG. 7A shows a front elevation view of oppositely oriented saturable wedge sections of the transducer of FIG. 4 rotated by 90 degrees.

FIG. 7B shows two superposed flux density versus permeability characteristics of FIG. 6, each corresponding to one saturable wedge section of FIG. 7A.

FIGS. 8 to 11 show a preferred method of manufacturing the transducer of FIGS. 2A and 4.

FIGS. 12 to 16 show other preferred embodiments of the invention.

FIGS. 17 to 20 show an alternative embodiment of the invention.

FIGS. 21 to 25 show respective diagrams illustrating the operation of the embodiment of FIGS. 17 to 20.

DETAILED DESCRIPTION

In the following description and drawings, like elements will be designated by like reference numerals. The description of similar elements and circuit portions illustrated in more than one figure of the drawings may not be repeated with reference to each of the figures.

To facilitate description of the operating principle of the magnetically controlled scanning transducer of the invention, a basic transducing operation of a known magnetic transducer will first be described with reference to FIGS. 1A and 1B. Thereafter a scanning operation in accordance with the invention will be described with reference to FIGS. 1C and 1D.

FIG. 1A schematically shows a magnetic transducer 20 of a conventional design, having a body of magnetic material defining magnetic core portions 21 and 22 with confronting poles 27, 28 thereof defining a transducing gap 26 therebetween. A transducing winding window 24 is provided to accommodate transducing windings 25 that interact with magnetic flux supportable by the body to convert information represented by the same into electrical signals, and vice versa.

The transducing gap 26 comprises a nonmagnetic material, for example silicon dioxide or glass, as well known in the art. When an electrical signal representative of desired information is applied to the transducing winding 25, for example from a signal source 7, for recording such information on a magnetic storage or record medium, such as tape 42, a magnetic field is formed within the transducer body as represented by flux lines 16 containing the information. The magnetic field is emitted from the faces of the core portions adjacent the transducing gap 26, in the form of a fringing flux which engages the tape 42. The tape is shown in FIG. 1A as transparent to reveal a portion 41 of the transducer 20 which confronts the tape and which portion will be further referred to as face 41. It is this face of the transducer body which is sufficiently close to the medium to interact magnetically with the same under typical operating conditions, although, of course, most interaction occurs immediately adjacent gap 26. While in the arrangement being described, this face is rectangular in shape, other shapes can be effective under the same or different conditions. Moreover, although the boundaries of face 41 coincide with physical transducer edges, it is possible that the "face" of a transducer which will interact magnetically with a record medium may be different in size or shape from the transducer surface(s) which directly or indirectly confront such medium.

The fringing flux impresses on tape 42, a magnetic pattern corresponding to the signal in the winding 25. By advancing the magnetic tape past the transducing gap 26, for example in the direction of arrow 43, a changing magnetic signal pattern will be recorded along the tape as shown in FIG. 1B by arrows 5.

When transducer 20 is utilized as a reproduce head, to reproduce a previously recorded signal such as shown at 5 on tape 42, the flux emanating or fringing from the longitudinally moving tape 42 engages the gap 26 and is picked up thereby. The transducer 20 changes the magnetic flux 16 traversing the transducing windings 25 into an electric signal that is proportional to the recorded flux.

In accordance with the present invention and as schematically shown in FIGS. 1C and 1D, a transducer 20 has a transducer face 41 that is selectively saturated adjacent the transducing gap 26 on opposite sides of the same, as is shown by cross-hatched saturated regions 57, 58. The saturated regions 57, 58 define respective adjacent highly permeable unsaturated portions or regions 40, 46 on opposite sides of the transducing gap 26. At least parts of each of the portions 40, 46 are opposite one another at the gap to define a highly permeable transducing zone or segment 56 of a width W3, extending across the gap 26. (It is seen from FIG. 1C that the width W of the entire illustrated transducing gap, $W1+W2+W3$, equals a constant.)

Saturation of regions 57, 58 while retaining regions 40 and 46 unsaturated, preferably is achieved by controlling several interdependent factors. These factors include the core material and the make-up (material, configuration, etc.) of the transducer body. Another factor is the use of control windings represented schematically in phantom at 8 and 9, each linking respectively one core portion 21, 22 in a manner which will be further described in more detail. The windings 8, 9 supply a control current I1, I2 to induce a control flux 47, 48 in each core portion 21, 22. The locations of the windings and the magnitudes of the control currents I1, I2 are selected such that the flux induced thereby saturates the regions 57, 58 in each core half or portion as mentioned previously and as shown by cross-hatched areas in FIGS. 1C and 1D, while retaining regions 40 and 46 unsaturated. Preferably, the control currents are selected to prevent control flux from crossing the transducing gap or otherwise flowing from one core portion to the other.

By increasing the magnitude of one control current, for example I1, while proportionally decreasing the magnitude of the other control current, for example I2, the respective widths W1, W2, change proportionally and the transducing segment or zone 56 can be selectively moved along the width W of the transducing gap 26. For example, when it is desired to periodically scan the transducing segment 56 at a high speed along the entire transducer width W, a control circuit can be utilized which periodically changes inversely the magnitudes of both currents I1, I2 in a linear fashion, thereby changing the widths W1, W2 of the saturated portions 57, 58. To maintain a constant width W3 during scanning, it is necessary to maintain a constant sum of the changing, control currents, that is $I1+I2$ equals a constant.

It will be appreciated that it is possible to continuously change the width W3 of transducing zone 56 if desired, by changing the combined widths $W1+W2$ of the saturated portions 57, 58. Consequently, the transducing zone width W3 can be continuously narrowed, widened or otherwise modified.

As seen from FIG. 1C, the transducing flux path 16 extends around the winding window 24 and intercepts the transducing winding 25. The control flux preferably should not magnetically couple to the transducing winding. If the control flux lines 47, 48 extend generally in parallel planes with respect to the transducing flux 16 as shown, the respective magnitudes of the control currents are selected such that the resulting control fluxes 47, 48 are confined to their respective core portions 21, 22 and, thereby, do not link the transducing winding 25.

FIG. 1E illustrates an example of one mode of operation in which the electromagnetically controlled scanning magnetic transducer 20 of FIG. 1C is utilized for recording and/or reproduction. The transducer 20 is shown with the transducing gap area 26 sufficiently enlarged to allow showing therein of a magnetization pattern corresponding to the transducing flux 16. (For convenience it is illustrated as if the gap was magnetic.) In FIG. 1E a magnetic storage medium, for example tape 42, is transported longitudinally, that is, in the direction of arrow 43, in close proximity to the transducing gap 26, and substantially perpendicular to the transducer width W. In this mode of operation, the electromagnetic control windings 8, 9 are utilized to differentially saturate the regions 57, 58 periodically, thereby periodically varying the location of the transducing zone 56 along the width W of the entire transducer gap. The difference between the combined widths $W1+W2$ and the core width W determines the resulting width W3 of the transducing zone 56 ($W3=W-(W1+W2)$). It is possible to change the transducing zone width W3 by changing the combined widths $W1+W2$, as previously mentioned.

Scanning operation along recording tracks of the type shown at 35 in FIG. 1E, is obtained when the location of the transducing zone 56 moves along the width W, that is in the direction indicated by arrow 10, while the widths W1, W2 change inversely with respect to one another to maintain a constant transducing zone width W3. In the above-described scanning operation, which is generally referred to as transverse recording/reproduction, the width W corresponds to the length of scan on the magnetic tape 42. This type of recording is characterized by a magnetization pattern 14 in the tape extending substantially orthogonally to the direction of scan indicated by arrow 10, which pattern is recorded along parallel tracks 35 which in turn extend substantially orthongal to the width of the tape 42. The length L of the transducing gap 26 corresponds to the recorded "track width" TW on the tape. In recording mode, the magnetic state of the tape will be determined by the direction of the record flux at the approximate gap "trailing edge" of the scanning transducing zone 56 relative to the longitudinal direction 43 of transport of the tape 42, as the transducing zone is advanced along the track 35 by the scanning action. It follows from the foregoing that the width W3 of the transducing zone 56 is comparable to gap length of a conventional rotating magnetic transducer which is utilized for transverse recording. Therefore the transducing zone width W3 should be smaller than the shortest wave-length to be recorded to obtain necessary high resolution.

In FIG. 1F an example of another mode of operation of the scanning magnetic transducer 20 of FIG. 1C is shown. It is shown being utilized for recording/reproduction along a longitudinal track 13 of a magnetic tape 42, transported with respect to transducer 20 in a direction the same as that of the tape in FIG. 1E. In this mode of operation, however, when transducer 20 is utilized for recording the widths W1, W2 of the saturated regions 57, 58 are maintained constant, thereby maintaining a fixed position and constant width W3 of the transducing zone 56. The foregoing is obtained by maintaining selected constant magnitudes of the control currents I1, I2 applied by windings 8, 9. The resulting magnetization pattern obtained on the recorded track 13 is generally referred to as longitudinal recording.

When the transducer 20 of FIG. 1F is utilized for reproduction, i.e., to convert information represented by magnetic recording on track 13 to an electrical representation, the respective widths W1, W2 can be differentially varied to reposition the transducing zone 56 in either of the directions indicated by arrows 10 and 11. The foregoing operation mode may be particularly useful to maintain a desired position of the transducing zone 56 over a recorded track to optimize recording/reproducing performance. The latter mode of operation may be utilized when reproducing a signal recorded, for example, on transverse, helical or longitudinal tracks of a magnetic medium.

Through appropriate control of the widths W1, W2, various modes of operation can be achieved. For example, one desired track width W3 can be selected for recording and another, for example, narrower track width can be selected for playback by simply changing the widths W1, W2 of the saturated regions of each core portion, as previously mentioned. In another operating mode, the location of the transducing zone 56 can be repositioned with a desired high accuracy to predetermined discrete locations on a magnetic medium, as may be desired in connection with a particular recording scheme.

It should be understood from the above description, that in all the above-indicated operation modes one region of the face of the transducer is saturated adjacent the transducer gap while another region in proximity of the transducing gap is retained unsaturated. Consequently, susceptibility to pick-up at the face of crosstalk or stray flux by a non-operating core portion is eliminated.

To obtain high quality performance by the scanning transducer of the invention, a well defined boundary between adjacent saturated and unsaturated areas of the cores 21, 22 is desirable. The foregoing is obtained by selecting an appropriae material for the core as discussed below, and by arranging and configuring the confronting magnetic core portions and control windings in such a way that a maximum rate of change in permeability between adjacent cross-sectional areas of each transducer core portion is obtainable across the transducer width W. The foregoing assures that while a selected area at the face of each core portion is saturated by a control current so that no appreciable flux passes therethrough, an immediately adjacent contiguous area remains sufficiently permeable to transfer information signals. Consequently, the performance of the transducer 20 depends on the steepness of a permeability versus control flux density gradient between the adjacent saturated and unsaturated regions within each core portion.

As an example, FIG. 6 shows a well known permeability m versus flux density B characteristic of a suitable magnetic core body material, for example, ferrite PS52B made by Ampex Corporation. As seen from such figure, a relatively high permeability m, greater than 400, is obtainable with a flux density B below $B1 = 4000$ Gauss, which high permeability is sufficient for a desired transducing operation. The saturation flux density of that material is approximately $B2 = 6000$ Gauss, corresponding to a permeability below 100, as shown in FIG. 6. Essentially no transducing, cross-talk or stray flux can be picked up by the material when it is at such low permeability level. Consequently, for obtaining a desired rapid transition between a highly permeable region and an adjacent saturated region within the transducer core, the permeability must change rapidly from over 400 to below 100 in either direction, as it is seen from FIG. 6.

Now a preferred embodiment of the electromagnetically controlled scanning magnetic transducer of the present invention will be described in detail with reference to FIG. 2A. A magnetic transducer 20 has two corresponding magnetic core portions 21, 22 having confronting poles 27, 28 abutting at smoothly lapped and polished surfaces defining transducing gap plane 23. A winding window 24 is provided in one or each core portion 21, 22 to accommodate transducing windings 25. A suitable nonmagnetic material is provided between the pole faces 27, 28 to obtain a transducing gap 26, utilizing conventional transducing gap forming techniques. A transducer face 41, facing a magnetic record medium, for example tape 42, (also shown in FIGS. 2B to 2D), extends in a plane substantially perpendicular to the gap plane 23. The transducer may be contoured, if desired, as shown by interrupted lines 18, to obtain a desired contour and transducing gap depth respectively, utilizing well known contouring techniques.

In accordance with an important feature of the embodiment of FIG. 2A, apertures 31, 32 are provided in each corresponding core portion 21, 22, respectively. These apertures extend across the entire width W of transducer 20 at respective selected angles to both the transducing gap plane 23 and to the face 41 of the transducer. Control windings 38, 39 are wound around each core portion 21, 22 in such a way that parts 51, 52 thereof extend through apertures 31, 32, respectively.

In the preferred embodiment of FIG. 2A, core portions 21, 22 are manufactured as two identical core halves, for example, from a block of magnetic ferrite material such as ferrite PS52B or single crystal ferrite. The apertures 31, 32 may be obtained by diamond drilling through the width of each core half, that is, from upper lateral surfaces 33, 34 to the opposite lateral surfaces 36, 37, respectively. The surfaces of each core half 21, 22 defining the gap plane 23 are smoothly lapped and polished. A suitable nonmagnetic transducing gap forming material, such as glass, is provided on the surface of one or both core portions coincident with the plane 23 by, for example, sputtering in a vacuum. The thusly prepared core halves 21, 22 are assembled by rotating one core half with respect to the other by 180 degrees so that the upper and lower surfaces thereof are reversed, to obtain confronting core portions with an inversely symmetrical arrangement of the apertures 31, 32 with respect to planes 23 and 41, respectively. Thus, in the assembled transducer, the control winding apertures 31, 32 extend in an oppositely oriented angular relationship with respect to both the transducing gap plane 23 and face 41. Utilizing well known bonding techniques, the assembled core halves are glass-bonded together at the transducing gap plane 23 to obtain the transducing gap 26.

Alternatively, confronting core portions 21, 22 could be provided by a common solid block of magnetic material, if desired. In that case, a slot of a desired width corresponding to transducing gap length is provided inwardly of face 41 by, for example, grinding, into the solid block. The slot is subsequently filled with a suitable nonmagnetic material to obtain a transducing gap 26. The winding window 24 and control winding apertures 31, 32 are then obtained by drilling across the transducer width utilizing known drilling techniques.

As will be described in more detail below, control windings 38, 39 serve to carry control currents I1, I2 for differentially saturating selected portions of each core portion 21, 22 at the transducer face 41 to obtain magnetically saturated face regions and an unsaturated highly permeable transducing zone 56 extending across the transducing gap 26, as has been described before with respect to FIGS. 1C and 1D.

In the preferred embodiment, the control currents I1, I2 are varied differentially to periodically scan a transducing zone or segment of a constant width across the entire width W of the transducer. Thereby, an information signal is recorded or reproduced along transverse tracks 35 on a longitudinally transported in the direction of the arrow 43 magnetic tape 42, as shown in FIG. 2B. It will be understood, however, that alternatively other recording/reproducing approaches can be used. For example, when current values I1, I2 are maintained constant, the transducing zone will assume a fixed position. This latter application may be useful to obtain recording along longitudinal tracks such as shown at 13 in FIG. 2D. During recording/reproduction on longitudinal or helical tracks, the position of the transducing zone may be stepped from track to track. In other applications, recorded diagonal tracks 12 as shown in FIG. 2C, such as obtained by helical scan recorders, may be reproduced by the transducer of the invention fixedly mounted in a rotating drum, while the position of the transducing zone may be moved across the recorded track width to assume optimum playback performance.

FIG. 3A is a schematic diagram of a control circuit 54 utilized to drive the control windings 38, 39 of transducer 20 to control the position of a transducing zone at face 41 along the width W of the transducer 20. In the presently described preferred embodiment, the transducing zone 56 (shown in FIG. 4) is periodically scanned across the width, W, of the transducer 20 to follow transverse tracks 35 of magnetic tape 42, as shown in FIGS. 1E and 2B. It will be understood, however, that the control circuit 54 may be adapted to obtain different operating modes of the transducer 20 when utilized in other recording/reproducing applications as previously mentioned.

The circuit 54 of FIG. 3A utilizes a control voltage source 61 generating a periodically changing control voltage Vc. Voltage Vc is converted by the circuit of FIG. 3A into differentially changing control currents I1, I2 as follows. The voltage Vc is applied via a resistor 62 to an inverting input of a first operational amplifier 63, which has a feedback resistor 64 and is arranged as a voltage follower. The output of amplifier 63 is connected via a further resistor 65 to an inverting input of a second operational amplifier 66 which has a feedback resistor 67. Amplifier 66 inverts the output signal of amplifier 63. The output of first amplifier 63 is also connected via a resistor 68 to an inverting input of a third operational amplifier 69 having a feedback resistor 70. The output of second amplifier 66 is connected via a resistor 71 to an inverting input of a fourth amplifier 72 having a feedback resistor 73. An adjustable potentiometer 74 is connected between a source of negative D.C. voltage and ground to obtain a control current offset Io. The output of potentiometer 74 is connected via a resistor 75 to the inverting input of third amplifier 69 and via a resistor 76 to the inverting input of fourth amplifier 72, respectively.

The output of the third amplifier 69 is connected to the previously described first control winding 38 of transducer 20, which in turn is connected via feedback resistor 70 to the inverting input of amplifier 69. Similarly, the output of the fourth amplifier 72 is connected to the previously described second control winding 39 of transducer 20, whose second terminal is connected via feedback resistor 73, to the inverting input of amplifier 72. The connection between control winding 38 and resistor 70 is grounded via a resistor 77. Similarly, the connection between control winding 39 and resistor 73 is grounded via a resistor 78. The respective non-inverting inputs of all four operational amplifiers 63, 66, 69 and 72 are grounded. The amplifiers 69, 72 and respective resistors 70, 77 and 73, 78 represent first and second current sources, respectively.

In operation, the voltage Vc from source 61 is applied via voltage follower 63, 64 to a first current source 69, 70, 77, which applies to the first control winding 38 a control current I1 directly proportional to input voltage Vc. The voltage obtained at the output of amplifier 63 and inverted by the inverter 66, 67 is further applied to the second current source 72, 73, 78, which applies to the second control winding 39 a control current I2 inversely proportional to the input voltage Vc. The potentiometer 74 connected to a negative DC voltage sets a desired control current offset Io, which in the presently described embodiment is half way between the minimum and maximum control current values, that is $Io = (Imax - Imin)/2$, as will be described below in more detail with reference to FIG. 3B.

It follows from the foregoing description that when voltage Vc has a periodically changing amplitude between Vcmin and Vcmax as shown in the diagram of FIG. 3B, circuit 54 converts the thusly changing control voltage into control currents I1, I2 obtained at the outputs of the first and second current sources, respectively, which change linearly. The control currents I1, I2, thus change differentially, that is in opposite sense with respect to each other, while changing substantially in linear proportion to the input voltage Vc, as depicted in FIG. 3B and defined by the following equations:

$$I1 = KVc + Io \qquad (1)$$

$$I2 = -KVc + Io \quad (2)$$

where K and Io are constants dependent on the parameters of the circuit of FIG. 3A and can be derived therefrom.

With further reference to the previously described preferred embodiment of FIG. 2A, currents I1, I2 induce magnetic flux in the magnetic core portions surrounding the control winding portions 51, 52 extending therethrough. The control currents I1, I2 are utilized to saturate selected volumes of the magnetic core portions 21, 22 containing their respective face portions 41 to obtain the saturated face regions (such as regions 57 and 58 of the transducer embodiment shown in FIG. 1C) and an unsaturated highly permeable transducing zone (such as Zone 56 of the embodiment shown in FIG. 1C) in accordance with the present invention, as described below.

FIG. 4 shows a more detailed schematic representation of the transducer 20. Two pairs of imaginary planes 44, 45 and 59, 60 are shown as being respectively superposed with the longitudinal axis of apertures 31, 32, respectively. Planes 44, 45 are parallel and intersect upper and lower lateral surfaces 33, 34 and 36, 37, respectively, along lines parallel with the transducing gap plane 23. Planes 59, 60 intersect these lateral surfaces along lines perpendicular to the transducing gap plane 23.

It is seen from FIG. 4 that the imaginary planes 44, 45, 59, 60, lateral surfaces 33, 34, 36, 37, gap plane 23 and face 41 form two oppositely oriented wedge sections 49, 50, on opposite sides of the transducing gap. These wedge sections represent portions of magnetic cores 21, 22 to be selectively saturated differentially by the control currents I1, I2 to thereby define a desired transducing zone 56.

FIG. 5 is an enlarged perspective view of one wedge section 50. Since both oppositely oriented wedge sections are substantially identical, the following description related to wedge section 50 also generally applies to wedge section 49. It is seen from FIG. 4 that edge 30 of wedge section 50 in FIG. 5 is defined as an intersection of imaginary planes 45, 60. For a given width W of the transducing gap 26, wedge section 50 can be imagined as being divided into parallel cross-sectional areas L1 to Ln, extending perpendicularly to both gap plane 23 and transducer face 41, respectively, and having gradually increasing surface areas along the gap width. It is understood that the oppositely oriented wedge section 49 of transducer 20 will have corresponding cross-sectional areas gradually increasing in the opposite direction (not shown).

With further reference to FIGS. 4 and 5, when current I2 is applied to the control winding 39, it induces in the core portion 22 a corresponding magnetic flux represented by flux lines 48 extending around the winding portion 52. Because the highly permeable core portions 21, 22 have a low reluctance relative to that of the transducing gap 26, control flux lines 48 tend to be confined within the bodies forming the core portions and do not extend across the transducing gap 26 to link the transducing windings 25. This minimizes interference between the control flux and the transducing signal flux within the transducer.

To assure proper movement of the transducing zone 56 along the width of the transducer, the values of the oppositely changing currents I1, I2 are selected such that the control fluxes 47, 48 induced thereby saturate in succession the continuously changing cross sectional areas L1 to Ln of the respective oppositely oriented wedge sections 49, 50 within each magnetic core half 21, 22. For example, when a gradually increasing current I2 is applied to the control winding 39, the cross-sectional areas L1 to Ln of FIG. 5 become gradually saturated from the smallest to the largest area, in direct proportion to the increasing amplitude of the control current I2. By increasing the control current in one control winding while decreasing the control current in the other control winding by a corresponding amount, different respective portions of the oppositely oriented wedge sections 49, 50 become periodically differentially saturated and unsaturated, which results in the movement of the transducing zone 56 along the gap 26. By periodically changing the control currents in this manner, the transducing zone 56 is scanned along the width of the transducing gap to effect, for example, recording and reproducing with respect to a sequence of tracks extending transversely along a tape record medium, such as illustrated in FIG. 1E. In the preferred embodiment of FIG. 4, the sum of the differentially changing currents I1 + I2 is maintained constant to obtain a constant width W3 of the transducing zone 56 at the transducer face 41, as previously described. It is understood from the foregoing description that the permeability of the saturated regions is approximately equal to that of air while the overlapping unsaturated portions have a relatively high permeability as is necessary for signal recording/reproduction.

It is seen from the characteristic of FIG. 3B, that by changing the control voltage from −Vcmin to +Vcmax, the control current value I1 changes from Imin to Imax, where Imax is selected below the saturation current level Isat. Isat corresponds to a current value which is sufficient to saturate all the cross-sectional areas L1 to Ln, that is the entire wedge section, without leaving an unsaturated area therein. Since it is necessary to assure that an unsaturated area will remain in each wedge section 49, 50 for obtaining a transducing zone, the maximum control current Imax is selected below the saturation current level Isat.

Preferably, the apertures 31, 32 within core halves 21, 22 are arranged such that substantially square cross-sectional areas L1 to Ln are obtained. The foregoing assures that the wedge sections 49, 50 including face 41 will be saturated without saturation of core portions which are remote from the face regions. Also, this minimizes control current values necessary to obtain saturation.

FIG. 7B shows an example of two superposed flux density versus permeability characteristics 53, 53a, each corresponding to the characteristic of FIG. 6 and each pertaining to one of the oppositely oriented wedge section 49, 50 shown in FIG. 7A. FIG. 7A is a schematic front view representation of wedge sections 49, 50 of FIG. 4 rotated by 90 degrees. The cross-hatched areas 57, 58 represent the saturated regions, that is, core portions having a permeability less than 100. The other core portions in FIG. 7A represent nonsaturated highly permeable areas 40, 46 having a permeability over 400. The magnetically permeable zone which extends across the transducing gap 26 and which is formed by the overlapping unsaturated highly permeable regions 40, 46, corresponds to overlapping portions of superposed characteristics 53, 53a which portions indicate permeability between 100 and 400. From FIGS. 7A and 7B it is seen that a well defined transducing zone requires a permeability versus flux density gradient as sharp as possible. The latter requirement can be obtained by selecting a transducer core material with a steep characteristic curve and by designing the wedge section such that large flux density changes take place between adjacent cross-sectional areas over the entire scanning length, i.e., the width of the transducing gap. To further increase the permeability gradient a head core material is preferably used having a magnetic anisotropy and oriented with an easy axis of magnetization perpendicular to the transducing gap plane.

To further maximize the flux density gradient between two adjacent cross-sectional areas, it is preferable to approximate the shape of the wedge sections to that of the characteristics of FIG. 6, that is, to obtain exponentially increasing cross sectional areas L1 to Ln of the wedge sections 49, 50. The foregoing can be obtained by having the apertures 31, 32 extending through the cores 21, 22 along exponential paths. However, with respect to design considerations, it may be difficult to form such an opening in a solid core of magnetic material.

The manufacture of the transducer of the kind illustrated in FIGS. 2A and 4 is simplified, specifically with respect to obtaining an exponential wedge shape, by the construction of the embodiment illustrated in FIGS. 8 to 11. FIG. 8 shows an exploded perspective view of a preferred embodiment of a laminated magnetic core structure 81, comprising a plurality of thin magnetic laminations 82, for example 0.001 inches thick, of which only four laminations are shown in FIG. 8 for clarity. The laminations 82 may be, for example, etched from a sheet of a suitable magnetic material, for example, permalloy or mumetal HiMu 80. In FIG. 8, the overall shape and size of all laminations are identical, with the exception of the apertures 32, which are progressively displaced from lamination to lamination in such a way that when all the respective laminations are stacked as shown in FIG. 9, the resulting aperture corresponds to the previously described aperture 32 for accommodating the control windings 39 as shown in the embodiment of FIG. 4.

The stacked laminations of FIG. 9 are bonded, for example, by epoxy, utilizing well known bonding techniques to form a laminated head core half 81, which corresponds to the previously described half core 22 shown in FIG. 4. Two corresponding laminated half cores 80, 81 are lapped at their respective sides defining gap plane 23 and a nonmagnetic transducing gap forming material, for example, silicon dioxide, is vacuum sputtered thereon utilizing known sputtering techniques. The corresponding core halves 80, 81 are assembled in such a way that one core half is rotated 180 degrees with respect to the other core half, as shown by arrow 15 in FIG. 10, so that the respective control winding apertures 31, 32 extend inversely symmetrical to the gap plane 23 and face 41, respectively, similarly as described with respect to the embodiment of FIG. 4.

The assembled core halves 80, 81 are bonded together with epoxy utilizing known bonding techniques. The resulting laminated core structure 80, 81 is preferably contoured at the transducer face 41 to obtain a desired contour as shown at 41a in FIG. 11, and to obtain a desired transducing gap depth. Thereafter, the control windings 38, 39 are arranged around each core half 80, 81 with respective portions extending through apertures 31, 32 similarly as has been described with reference to FIGS. 2A and 4. The transducing winding 25 is wound around the rear portion of cores 80, 81, generally symmetrical thereto, through a winding window 24. The relative placement of transducing winding 25 with respect to the control windings 38, 39 is not critical in either the embodiment of FIG. 4 or the embodiment of FIG. 11, as long as the control flux does not magnetically couple with the transducing winding.

While the embodiment shown in FIGS. 8 to 11 yields a resulting core configuration which is basically similar to that of FIG. 4, it has the advantage of eliminating the requirement of having to drill through the core to obtain control winding apertures. It will be appreciated that by making each lamination 82 with a properly located control winding window therein, any desired window shape, for example exponential, can be obtained with relative ease.

Further preferred embodiments of the electromagnetically controlled scanning transducer of the invention are shown in FIGS. 12 to 16. As will become apparent from the description below, these embodiments have the advantage over the previously described embodiments of establishing a more uniform saturation along the face of the transducer. In addition, these embodiments provide more discrimination between saturated and unsaturated face regions. In addition, a desired magnetic core shape, such as having exponentially increasing cross sectional areas can be obtained in a simplified manner.

With reference to FIG. 12, a plurality (three of which are shown) of magnetic laminations 301 are stacked to form a laminated core stack 305. Each lamination has a central opening 314 which serves as a control winding window. A closed control flux path 304 is formed in the plane 303 of each lamination around the control winding window 314. Adjacent laminations in the stack 305 have gradually increasing lengths of control flux paths 304. The foregoing is obtained as shown in FIG. 12, by providing adjacent laminations in one transverse direction with longer dimensions in the direction of arrow 312. The increasing lengths of the laminations provide increasing flux path lengths and consequent flux path reluctances in such transverse direction of adjacent laminations. As a result, laminations of different lengths will reach saturation at different magnitudes of control currents. This is in contrast to embodiments of the present invention, such as illustrated in FIG. 4, wherein the varying cross-sectional area of the core bodies perpendicular to the direction of the control flux path determines the control current magnitudes at which core portions saturate. Preferably, each lamination has the same thickness and a substantially constant width 302 in the direction perpendicular to the control flux path 304. As an example, the laminations 301 may be made of mumetal HiMu80, permalloy, or amorphous metal, having a thickness of 0.0001 to 0.001 inches.

A groove 315 for accommodating transducing windings is provided inwardly of surface 308 defining a transducing gap plane. The boundary lengths of the laminations 301 may increase linearly, exponentially or in any other desired relationship to obtain the above-mentioned desired increase in flux path lengths. In this embodiment, an exponential increase in the flux path length is provided to obtain a desired steep permeability versus flux density gradient between adjacent cross-sectional areas 303 across the transducer width W, for the reasons previously discussed with reference to the other transducer embodiments.

The stacked laminations 301 are bonded together in a manner similar to the previously described embodiment of FIGS. 8 to 11. A resulting half-core stack 305 is shown in FIG. 13. Two corresponding stacks 305, 305a are assembled and joined together as shown in FIG. 14, with their respective surface 308 (FIG. 13) defining transducing gap planes abutting and with a nonmagnetic transducing gap forming material disposed therebetween, utilizing techniques similar to those previously described with respect to the embodiment of FIGS. 8 to 11. It is seen from FIG. 14 that the corresponding core stacks on each side of the transducing gap are oppositely oriented as follows. These core stacks are assembled such that the control flux path lengths 304, 304a in each core 305, 305a, increase in opposite directions across the width W of the transducer. These gradually increasing flux path lengths serve to obtain differential saturation at the face 306 on opposite sides of the transducing gap 307, for example, as shown by cross-hatched areas 353 and 354 in FIG. 14. Respective widths W1, W2 of the saturated regions 353, 354 are selected such that a desired unsaturated, highly permeable transducing zone 333 of a desired width W3 is obtained at the face 306 by overlapping unsaturated regions, similarly as previously described with reference to FIG. 4.

As shown in FIG. 14, respective control windings 331, 332 are wound around each core half 305, 305a through control winding windows 314, 314a, provided preferably in the proximity of the transducer face 306, 306a. A transducing signal winding 334 is wound around the assembled cores 305, 305a through the transducing winding window 315. Transducing zone 333 can be scanned across the width W of the transducer by, for example, utilizing a control circuit similar to that previously described with reference to FIG. 3A.

A variation in the transducer structure of FIGS. 12 to 14 is described below with reference to the embodiment shown in FIGS. 15 and 16. FIG. 15 shows one half of a composite head core 318 which differs from the core 305 of the above-described embodiment shown in FIG. 13. The core 318 of the transducer embodiment of FIG. 15 has a monolithic front core 320 and a laminated back core 321 which are integrally joined together by, for example, epoxy bonding, at confronting surfaces 325, 327 to eliminate air gaps. The front core 320 may be made from, for example, a block of magnetic ferrite material such as PS52B. A groove 322 is provided in front core 320 inwardly of a transducing gap plane 323 to obtain a transducing winding window. The laminated back core 321 is formed of a plurality of individual U-shaped laminations 326 having the varying boundary length dimensional relationships relative to the location of the face 306 that confronts the tape as described with respect to the laminations 304 of the transducer embodiment shown in FIGS. 12 to 14. An open control winding window 324 is provided extending inwardly of a front surface 325 defined by the stacked laminations 326. As in the embodiment of FIG. 14, the respective laminations have a substantially constant width 329 in the direction perpendicular to a control flux path 335 extending in the lamination plane as shown in FIG. 16. Similarly as in the embodiment of FIG. 14, adjacent laminations have gradually increasing lengths in the direction 328 to obtain oppositely increasing control flux path lengths and, thus, oppositely increasing reluctances in each core 318, 319 across the transducer width W. That increase preferably is exponential to maximize the permeability to flux density gradient as previously described with reference to the foregoing embodiments of the invention, although it could be linear.

The integrally joined front core 320 and back core 321 form a closed low reluctance control flux path as shown at 335 in FIG. 16. The respective back core laminations in the stack 321 are in close physical contact with one another to minimize magnetic losses at the interface between adjacent laminations. Further, assembly of the oppositely oriented corresponding cores 318, 319, and provision of the transducing and control windings are similar to above-described embodiment of FIGS. 12 to 14 and, therefore, the description thereof will not be repeated herein.

It follows from the above description that in the embodiments of FIGS. 12 to 16, a substantially constant cross sectional area of the laminations is maintained in a direction perpendicular to the control flux path while the lengths of control flux paths gradually increase differentially, that is in opposite directions, in the confronting core halves. To assure that the faces 306, 306a of the transducer will become saturated before other magnetic the embodiments of FIGS. 12 to 16 the width 355 (FIG. 15) of the flux path 304 (FIG. 14) or 355 (FIG. 16) along the face 306, 306a is preferably made slightly smaller than the width 302 (FIG. 12) or 329 (FIG. 15) along the rest of the flux path defined by the magnetic cores 305, 305a (FIG. 14) or 318, 319 (FIG. 16). By virtue of the constant cross-sectional area of the laminations perpendicular to the direction of the control flux paths (304, 304a in FIG. 14 and 335 in FIG. 16) across the faces 306, 306a of the transducer, each of the laminations will saturate uniformly along its extent at the faces when the control current in its associated control winding reaches the level corresponding to the saturation flux density for the lamination. In embodiments such as illustrated in FIGS. 2A and 4, in which a varying cross-sectional area perpendicular to the direction of the control flux path is determinative of saturation of the core portions, locations along the face distant from the control windings and transducing gap (for example, along the contoured face portions 18 in the embodiment of FIG. 2A) may not saturate anywhere along the width of the transducer. In addition, although each of the laminations is in magnetic contact with its adjacent laminations through each core portion, the junctions between the laminations necessarily render the laminated core portions magnetically anisotropic, with the easy axis of magnetization parallel to the lamination plane. This enables achievement of better discrimination, i.e., a sharper boundary or transition, between saturated and unsaturated portions along the transducing gap than can be obtained with an unlaminated body of corresponding structure.

It is an additional advantage of the embodiments of FIGS. 15, 16 that the monolithic front core 320 may be of a material different from the material of the back core 321. For example, the front core material may have magnetic anisotropy with an easy axis of magnetization oriented perpendicular to the transducing gap plane to further enhance the transducing zone definition.

Comparison of the embodiments of FIGS. 12-16 with the embodiment of FIG. 4 shows that progressive saturation of the oppositely oriented confronting core halves having gradually increasing control flux path lengths in opposite directions (embodiments of FIGS. 12-16) is similar to saturating the oppositely oriented wedge sections (embodiment of FIG. 4). Consequently, the operation of the embodiments of FIGS. 12 to 16 and of FIG. 4 is similar, in that the transducer face is differentially saturated on opposite sides of the transducing gap and that a high permeability transducing zone is formed which can be moved or scanned along the transducer width. However, the embodiments of FIGS. 12 to 16 are different in that the entire lamination planes making up the transducer body are saturated rather than only a portion of the transducer body as in embodiments such as shown in FIG. 4.

It will be understood that the laminated cores in the above-described embodiments are provided for manufacturing convenience, particularly, to facilitate obtaining a desired core shape, such as having exponentially increasing cross-sectional areas. Consequently, these magnetic laminations are in physical contact with each other and no magnetic or electrical insulation is needed between them.

An alternative embodiment of the present invention will be described now with reference to FIGS. 17 to 25, where saturation of the face region is obtained by a control winding in the form of a conductive drive line 368, 368a extending through each confronting core portion, respectively, in close proximity to both the transducer face and transducing gap, respectively. The embodiment illustrated in FIGS. 17-25 is similar in certain respects to the embodiments illustrated in FIGS. 2A and 4, in certain other respects to the embodiments illustrated in FIGS. 14 and 16 and yet in other respects to the embodiment illustrated in FIG. 11. Like the embodiments of FIGS. 2A, 4 and 11, the embodiment illustrated in FIGS. 17-25 only need saturate the face of the transducer proximate the transducing gap to effect formation of the desired transducing zone. However, like the embodiments of FIGS. 11, 14 and 16, the embodiment illustrated in FIGS. 17-25 is laminated and, therefore, is magnetically anisotropic with the easy axis of magnetization parallel to the lamination plane. Consequently, this embodiment enables achievement of better discrimination between saturated and unsaturated portions like the embodiments of FIGS. 11, 14 and 16.

In this embodiment, the scanning transducer half-core 360 has discrete magnetic laminations 361 whose magnetic circuits are separated from one another by non-magnetic, electrically conductive laminations 363. The laminations 363 are conductively connected to the drive line 368 and each two conductive laminations and a portion of the drive line between them represent a current turn around a magnetic lamination 361. Each magnetic lamination becomes saturated by applying control current to surrounding conductive laminations and thus to a corresponding portion of the drive line extending therethrough. A transducing zone is obtained by one or more non-saturated laminations and it can be scanned or moved along the transducer width by switching on/off conductive laminations representing current turns, as is described below in more detail.

In addition to saturating the transducer face, the presently described embodiment has a further advantage over the prior art transducers in that a sharp step-like permeability-to-flux density gradient across the transducer face is obtained. That characteristic is virtually independent of the permeability versus flux density characteristic of the magnetic lamination materials, as will follow from further description.

FIG. 17 shows an exploded view of one transducer core half 360 in which magnetically permeable laminations 361 are stacked and interposed between conductive laminations 363. A layer of electrically insulating material 362, for example silicon dioxide 0.0001 inch thick, is preferably sputtered on the respective planar surfaces of each magnetic lamination 361 to electrically insulate the magnetic lamination from the conductive laminations 363. Each conductive lamination 363 has a lead wire 364 attached thereto, for example by soldering, at a rear portion thereof opposite a transducer face 365 of the core half. As an example, the magnetic laminations may be made of mumetal HiMu80 or amorphous metal, 0.001 inch thick, and the electrically conductive laminations of copper, 0.0005 inch thick. The respective laminations 361, 363 have overlapping apertures 366, 367 provided therein to accommodate a conductive drive line 368 which is conductively connected to each lamination 363, for example by soldering, but is electrically insulated from the magnetic laminations.

FIG. 18 shows a plan view of the assembled laminated half-core stack 360 of FIG. 17. FIG. 19 shows a cross-sectional view of the lamination stack 360 taken along line A—A of FIG. 18, and a schematic block diagram of a lamination switcher circuit 371 connected to the stack. (The circuit for the other stack preferably is identical.)

With reference to FIG. 19, one end of the conductive drive line 368 is connected via line 373 to one pole of a control current source 372, whose other pole is grounded. Each lead wire 364 is connected to one of a plurality of outputs 399 of the conductive lamination switcher circuit 371.

As an example, the conductive lamination switcher circuit 371 is illustrated as comprising an up/down counter 430, a programmable read only memory (PROM) 433 and a transistor switch array 429. The switch array 429 comprises a plurality of transistor switches, each having a transistor 434, a current setting collector resistor 435 and a base resistor 436. The up/down counter 430 has a clock signal input 437, a directional signal input 438, preset inputs P1 to Pn 428, a load input 439, and a plurality of outputs Q1 to Qn 431. Each output 431 is connected to one input 432 of PROM 433. PROM 433 has a plurality of outputs D1 to Dn 440, each connected to the base resistor 436 of one transistor 434 of the switch array 429. Each collector resistor 435 is connected to one conductive lamination 363 via a lead wire 364. The emitter of each transistor 434 is grounded.

FIG. 20 shows an electromagnetically controlled scanning magnetic transducer 378 obtained 360a. A transducing gap 381 of a suitable nonmagnetic material, for example, silicon dioxide, is provided on the transducing gap plane 380 of one or both core halves 360, 360a utilizing well known gap forming techniques. The respective core halves 360, 360a are assembled together inversely symetrical as follows. The core halves are reversed by rotating one core half 180 degrees with respect to the other core half, as indicated by arrow 357, so that the respective ends of conductive rods 368, 368a which are connected to current sources 372, 372a are reversed with respect to one another, that is, they are located on opposite sides across the transducer width W. A transducing signal winding 382, 382a is wound around the core halves and through a winding window 383 for use as a record/playback signal winding. (Filtering can be used in this embodiment to prevent objectionable coupling of the control signal to the transducing signal processor due to any magnetic coupling of control flux to the transducing winding.) The respective conductive laminations 363, 363a, of each core half 360, 360a are coupled via respective lamination switcher circuits 371, 371a to current sources 372, 372a to magnetically saturate sequentially the face of selected laminations in each core half, as will be described below.

An example of the operation of the scanning transducer of FIG. 20 will be described now with reference to FIGS. 21 to 25. Referring first to FIGS. 20 and 21, counters 430, 430a at their clock inputs receive a clock signal (A) having a frequency corresponding to a desired lamination switching frequency. One counter, for example 430, receives a directional signal (B) at a direction input while the other counter, for example 430a, receives a directional signal (D) of opposite polarity with respect to signal (B). One of the counters is preset to an initial count, which differs from the preset count of the other counter, to obtain an offset count corresponding to a line interval Z, as shown in FIG. 21. When one counter, for example counter 430, counts up, as is shown at (C) in FIG. 21, the other counter, for example counter 430a, counts down simultaneously therewith, as shown at (E). PROM's 433, 433a are programmed to convert the sequential binary count obtained at outputs 431, 431a of counters 430, 430a to a sequential output signal at outputs 440, 440a as is shown, for example, in TABLE 1 below:

TABLE 1

| Binary output at 431: | Output signal at 440: | | | | | |
|---|---|---|---|---|---|---|
| Pl to Pn | D1 | D2 | D3 | D4 | D5 ... | Dn |
| 0 | 0 | 0 | 0 | 0 | 0 ... | 0 |
| 1 | 1 | 0 | 0 | 0 | 0 ... | 0 |
| 2 | 1 | 1 | 0 | 0 | 0 ... | 0 |
| 3 | 1 | 1 | 1 | 0 | 0 ... | 0 |
| 4 | 1 | 1 | 1 | 1 | 0 ... | 0 |
| 5 | 1 | 1 | 1 | 1 | 1 ... | 0 |
| . | . | . | . | . | . | . |
| . | . | . | . | . | . | . |
| . | . | . | . | . | . | . |
| n | 1 | 1 | 1 | 1 | 1 ... | 1 |

As seen from FIG. 19, when any output D1 to Dn at 440 is activated, the particular transistor switch 434 connected thereto is switched on and connects the particular conductive lamination 363 to the current source 372 via a portion of the lead wire 364 and ground. When the uppermost conductive lamination 363 at the top of the stack 360 is connected with the current source 372, the first magnetic lamination 361 is threaded by the control current turn. When the next transistor switch is activated in the direction of the arrow 351, both the first and the second magnetic laminations 361 are threaded by the current turn, and so on, until the lowermost lamination of the stack is switched into the circuit when all the magnetic laminations 361 of the stack are threaded by the current turn. In each magnetic lamination threaded by a control current carrying turn, a magnetic flux is induced around the drive line 368, as shown by flux lines 376 in FIG. 18. The magnitude of the control current in the drive line 368 of each core half is selected large enough to saturate the portion of each surrounding lamination extending in an area defined by the face 65 of the core half, transducing gap plane 380 and the drive line 368, as indicated by a cross-hatched area 377 in FIGS. 18 and 20.

It is seen from a comparison with the previously described embodiment shown in FIGS. 2A and 4, that the relatively close location of the drive line 368 to both the face 365 and the transducing gap plane 380 of each core half of embodiment shown in FIGS. 17-20 is similar to the location of the winding portion 51 within core 21 of FIGS. 2A and 4. However, in that previously described embodiment the gradual saturation of the face within each core is obtained by a selected angled relationship of the control winding portion 51 relative to the face and gap planes, respectively, and by selectively varying the magnitude of a control current applied to the control winding. The embodiment illustrated in FIGS. 17-20 differs in that the saturated region of the transducer is obtained by selectively applying a control current to a portion of the conductive drive line which in turn saturates the face part only of those magnetic laminations which are threaded by the current turn. The saturated region is moved or scanned across the transducer width by switching the control current into different portions of the drive line. To obtain saturation at the face 365 of each lamination 361 prior to saturating other more distant portions thereof, the drive line 368 is preferably arranged relatively close to face 365 and gap plane 380 and substantially at equal distances therefrom.

With reference to FIG. 20, to obtain scanning of the transducing zone 386 across the transducer width W, one switcher circuit, for example circuit 371, is switched in one direction, for example, as indicated by arrow 351, while the other switcher circuit, for example circuit 371a, is switched synchronously therewith in the opposite direction of the arrow 352. Control current I1 from the current source 372 is therefore sequentially applied to (or disconnects from) conductive laminations 363 of one core half 360, while control current I2 from source 372a is sequentially disconnected from (or applied to) conductive laminations 363a of the other core half 360a. The thusly oppositely switched control currents I1, I2 gradually saturate the face portions of confronting core halves in opposite directions across the transducer width, while the number of active conductive laminations of the respective cores varies linearly but inversely, to maintain a constant transducing zone width. The previously mentioned counter offset Z (signal waveform 0) of FIG. 2') obtained by pre-setting one of the counters with respect to the other counter assures that one or more laminations in each stack will remain unsaturated at any time to obtain an overlapping transducing zone 386 across the gap 81, having a desired constant width W3.

The operation of the scanning transducer of FIGS. 17 to 20 will now be further described with reference to FIGS. 22 to 25. FIG. 22 is a schematic front view of the face portion 365 of one core half 360 of FIG. 20, rotated by 90 degrees. A saturated region 377 is shown by a cross-hatched area. For better comparison with previously described FIGS. 6 to 7B, as an example, a similar magnetic material is selected for the laminations 61, preferably, mumetal HiMu80.

FIG. 23 illustrates the flux density (B) versus permeability (m) characteristic 387 of the transducer face part 365 of FIG. 22. It is seen from FIG. 23 that the embodiment of the invention illustrated in FIGS. 17-20 has the advantage of obtaining a sharp step-like permeability-to-flux density gradient across the transducer width W. The latter feature results from separately "threading" each lamination by a respective control current turn. Consequently, while control current is supplied to a particular current winding surrounding a magnetic lamination to saturate its face part, an adjacent magnetic lamination which has its control current turned off will not have any control flux induced therein. Thus, a desired sharp change in flux density versus permeability results between adjacent unsaturated and saturated areas of the face regions, which change is virtually independent of the permeability versus flux density characteristic of the magnetic lamination material.

FIG. 24 is a schematic front view of the face portions 365, 365a of the oppositely oriented assembled core halves 360, 360a shown in FIG. 20, rotated by 90 degrees. By opposite orientation, it is meant that the respective control currents of each core half are switched into and out of circuit connection with the conductive laminations of the respective core halves in opposite directions across the width of the transducer, to obtain differential saturation of the transducer face on opposite sides of the transducing gap 381, as has been described with reference to FIG. 20.

FIG. 25 illustrates two superposed oppositely oriented characteristics 387, 387a of FIG. 23, each representing the permeability versus flux density characteristic of one core half 360, 360a of FIG. 24. A resulting well defined high permeability region is obtained as shown by an area between the superposed characteristics, which area contains the transducing zone 386.

It will be understood from the foregoing description that scanning or moving of the high permeability region and, hence, transducing zone 386 along the width W of the transducer in this embodiment is provided in discrete steps across the transducer gap width, each step corresponding to the combined thicknesses of a magnetic lamination, a conductive lamination and insulation layers, respectively.

It will be further understood that other implementations of the switcher circuits 371, 371a are possible. For example, instead of utilizing circuits 429, 430 and 433 of FIG. 19, switching of the laminations of each core half may be accomplished by utilizing a plurality of resistors (not shown), each resistor having a terminal connected to one conductive lamination and the values of the resistors connected to adjacent laminations increasing across the transducer width. The values of the resistors associated with each core half increase in the direction opposite the direction of increase of the resistors associated with the other core half. The other terminals of the resistors of each core half are connected to one pole of a variable voltage source, while the other, opposite pole of the voltage source is connected to one end of the conductive drive line. By varying the voltage in each core half in opposite directions, laminations of the opposite stacks become sequentially saturated and unsaturated, respectively, similarly as has been described with respect to the embodiment of FIGS. 17 to 25.

As a further alternative, instead of scanning the transducing zone symmetrically in both directions as shown at C and E in FIG. 21 where the respective time intervals T1, T2 are equal, it is possible to shorten one of the intervals with respect to the other one. Thus, a relatively long scanning interval in one direction and a fast return of the scanning zone in the other direction can be obtained by adjusting the timing of the switcher circuits 371, 371a accordingly.

It will be appreciated from the above that the invention is broad in nature and that many different modifications of the same can be made. It is not limited to any particular relationship of the transducer to the record medium. That is, it can be in contact or spaced from the same. Moreover, a body could be interposed between the transducer and the record medium, which body could be in contact or spaced away from the transducer body. The transducing zone and transducing gap do not both have to be in the same body. For example, a saturable, highly magnetic body such as is described in my co-pending patent applications filed Dec. 13th, 1985, Ser. Nos. 808,588 (abandoned in favor of Ser. No. 085,676 filed Aug. 6, 1987) and 808,924 (abandoned in favor of Ser. No. 128,115 filed Aug. 6, 1987, now U.S. Pat. No. 4,985,795), could provide the transducing zone. It therefore is not intended that the invention be limited other than by the claims and their equivalence.

What is claimed is:

1. An electromagnetically controlled magnetic transducer for transferring information to or from a magnetic record medium, comprising:

a magnetic head having a pair of core portions defining a transducing gap therebetween which has a width dimension extending in the direction of a width dimension of said transducer, each of said core portions having a gradually increasing magnetic path reluctance along the width dimension of said transducer with the reluctance of each core portion increasing in a direction opposite the other, said head having a pair of transducer face portions respectively associated with said core portions through which transducing flux flows to or from said magnetic record medium;

control means including a pair of control windings each of which extends across a width of a respective one of said core portions to receive a control current for selectively magnetically saturating a first region of the face portion associated with said core portion to generally prevent the flow of transducing flux therein while a second region of said face portion is magnetically unsaturated to enable the flow of transducing flux to occur therein, at least a part of each of said second regions being adjacent a corresponding part of the other of said second regions in a direction transverse to the width of said gap to provide a signal transfer zone for both entry and exit of transducing flux; and means coupled to said windings for applying said control currents to said control windings.

2. The magnetic transducer of claim 1 wherein said signal transfer zone is a portion of said transducing gap and each of said transducer face portions is a surface of a corresponding one of said core portions.

3. The magnetic transducer of claim 1, wherein said control means defines a steep magnetic permeability versus flux density gradient between said first and second regions of each face portion.

4. The magnetic transducer of claim 3 wherein said control means provides a permeability generally equal to or less than 100 in said first region of each face portion while providing a permeability generally equal to or greater than 400 in said second region of each face portion.

5. The magnetic transducer of claim 1 wherein said transducer gap is in a plane and wherein each of said control windings extends across its respective core portion in an angular relationship with respect to said transducing gap plane and to the transducer face portion associated with its respective core portion, the angular relationship of said control winding extending across one core portion being oppositely oriented with respect to the angular relationship of the other control winding across the other core portion so that said first regions of saturated face portions are faces of oppositely oriented saturated wedge sections in the respective core portions having cross-sectional areas gradually increasing in opposite directions on opposite sides of said transducing gap.

6. The magnetic transducer of claim 5 wherein said gradually increasing cross-sectional areas are substantially square-shaped and extend perpendicularly to both said transducing gap plane and to said transducer portions face, respectively.

7. The magnetic transducer of claim 5 wherein each of said core portions comprises a plurality of stacked magnetic laminations, each of which has an aperture for accommodating the control winding of the core portion of which said lamination is a part, said apertures of the laminations of each one of the core portions being progressively displaced from lamination to lamination across said transducer in a direction along the width of the transducer with the direction of progressive displacement in one core portion being opposite that in the other core portion to provide oppositely oriented angular relationships for said windings.

8. The magnetic transducer of claim 7 wherein said apertures are displaced to form a substantially linear path across the core portion of stacked magnetic laminations.

9. The magnetic transducer of claim 7 wherein said apertures are displaced to form a substantially exponential path across the core portion of stacked magnetic laminations.

10. The magnetic transducer of claim 1 wherein the signal transfer zone has a width extending in the direction of the transducing gap width dimension that is of a size and at a location determined by the magnitudes of the control currents applied to said windings, and said means for applying said control currents applies control currents to said windings of magnitudes having a sum that is varied to modify the size of the width of said signal transfer zone in the direction of said transducing gap width dimension.

11. The magnetic transducer of claim 1 wherein the signal transfer zone has a width extending in the direction of the transducing gap width dimension that is of a size and at a location determined by the magnitudes of the control currents applied to said windings, and said means for applying said control currents applies currents of constant magnitudes to said windings to maintain a predetermined location and constant width of said signal transfer zone.

12. The magnetic transducer of claim 1 wherein the signal transfer zone has a width extending in the direction of the transducing gap width dimension that is of a size and at a location determined by the magnitudes of the control currents applied to said windings, and said means for applying said control currents applies control currents to said windings of magnitudes that are periodically varied.

13. The magnetic transducer of claim 12 wherein said means for applying said control currents periodically varies the magnitudes of said currents in opposite senses to obtain periodic variation of the location of said signal transfer zone in the direction of said transducing gap width.

14. The magnetic transducer of claim 1 wherein the signal transfer zone has a width extending in the direction of the transducing gap width dimension that is of a size and at a location determined by the magnitudes of the control currents applied to said windings, and said means for applying said control currents applies control currents to said windings of magnitudes that are varied linearly and in opposite senses with respect to one another while maintaining a constant sum of said control currents, to vary the location of said signal transfer zone while maintaining a constant width thereof.

15. The magnetic transducer of claim 1 wherein each of said control windings extends in a substantially linear path across said transducer width.

16. The magnetic transducer of claim 1 wherein each of said control windings extends in a substantially exponential path across said transducer width.

17. The magnetic transducer of claim 1 wherein said transducer face portions are parallel to one another and said transducing gap has a depth dimension generally perpendicular to said transducer face portions, and wherein each of said core portions has a gradually increasing depth along the direction of said transducing gap width dimension to provide said gradually increasing magnetic path reluctances.

18. The magnetic transducer of claim 1 wherein each of said core portions has a central control winding window provided therein to accommodate said control winding and define control flux paths in said core portions that have substantially the same width and are bordered by said central control winding windows.

19. The magnetic transducer of claim 18 wherein said transducer face portions provide paths for control flux which have a relatively smaller width than said widths of the control flux paths in the core portions.

20. The magnetic transducer of claim 1 wherein each of said core portions comprises a monolithic front core portion and a laminated back core portion integrally joined therewith, each of said laminated back core portions comprising a plurality of stacked magnetic laminations.

21. The magnetic transducer of claim 20 wherein each of said stacked magnetic laminations is generally U-shaped.

22. The magnetic transducer of claim 20 wherein the stacked magnetic laminations of each of said core portions define a central control winding window for the core portion of which they are a part to accommodate the control winding associated with said core portion.

23. The magnetic transducer of claim 20 wherein each of said laminated back core portions has a depth that is generally perpendicular to said transducer face portions, and said gradually increasing reluctances of each of said core portions is obtained by progressively increasing the depths of the laminations of each core portion from lamination to lamination along the direction of said transducer gap width dimension.

24. The magnetic transducer of claim 20 wherein the stacked laminations of each of said core portions provides its associated core portion with an easy axis of magnetization in a direction perpendicular to a plane defined by said transducing gap.

25. The magnetic transducer of claim 1 wherein said transducing gap defines a plane and each of said core portions is provided with an easy axis of magnetization in a direction perpendicular to the transducing gap plane.

26. An electromagnetically controlled magnetic transducer for transferring information to or from a magnetic record medium, comprising:
   a magnetic core having two corresponding core portions with poles abutting at a transducing gap plane to define a transducing gap therebetween of a selected width and form a transducer face through which transducing flux flows for interaction with said magnetic record medium;

first and a second control windings each having a portion extending across a corresponding one of said core portions in the direction of the width of said transducing gap, each said winding extending across its respective core portion in an angular relationship with respect to both said transducing gap plane and said face of said transducer, the angular relationship of said first control winding across its core portion being oppositely oriented with respect to the angular relationship of said second control winding across its core portion;

said first and second control winding portions, said transducer face and gap plane, defining oppositely oriented saturable wedge sections, each wedge section having a cross sectional area that increases in the direction of the width of said transducer gap with the direction of area increase in one wedge section being opposite that in the other; and each of said first and second control windings being coupled to receive a control current for selectively saturating a first region of its associated one of said oppositely oriented wedge sections, each of said saturated first regions defining an adjacent unsaturated highly permeable second region of said wedge section, at least parts of said second region of one wedge section being opposite said second region of the other wedge section to provide both entry and exit of transducing flux.

27. The magnetic transducer of claim 26 further comprising means for applying said control currents to said control windings.

28. The magnetic transducer of claim 27 wherein said core portions are made of a monolithic magnetic material and wherein each core portion has an aperture for accommodating a portion of a respective one of said control windings.

29. The magnetic transducer of claim 26 wherein each of said core portions is provided with an easy axis of magnetization in a plane perpendicular to the transducing gap plane.

30. The magnetic transducer of claim 26 wherein each of said core portions is made of a plurality of stacked magnetic laminations which are in magnetic contact with one another, each lamination having an aperture for accommodating the control winding associated with the core portion of which the lamination is a part and wherein said apertures are progressively displaced from lamination to lamination in each stack of laminations to obtain said angular relationship.

31. The magnetic transducer of claim 30 wherein said apertures are displaced linearly.

32. The magnetic transducer of claim 30 wherein said apertures are displaced exponentially.

33. An electromagnetically controlled magnetic transducer for transferring information to or from a magnetic record medium, comprising:
a magnetic core having two corresponding core portions with poles abutting at a transducing gap plane to define a transducing gap therebetween of a selected width and form a transducer face through which transducing flux flows for interaction with said magnetic record medium;
each of said core portions defining a central control winding window and providing a control flux path plane extending substantially perpendicular to both said transducing gap plane and a transducer face adjacent said transducing gap, the control flux paths of each core portion having gradually increasing magnetic path reluctance in the direction of the width of the transducing gap with reluctance of one core portion increasing in a direction opposite that of the other core portion; and
a control winding arranged in the control winding window of each core portion, respectively, each of said control windings being coupled to receive a control current for selectively saturating a portion of said transducer face.

34. The magnetic transducer of claim 33 wherein each of said magnetic core portions comprises a plurality of stacked magnetic laminations, and adjacent ones of said stacked magnetic laminations are magnetically insulated from one another.

35. The magnetic transducer of claim 33 wherein each of said magnetic core portions comprises a plurality of stacked magnetic laminations, and adjacent ones of said stacked magnetic laminations of each core portion are in magnetic contact with one another.

36. An electromagnetically controlled magnetic transducer for transferring information to or from a magnetic record medium, comprising:
a magnetic core having two corresponding core portions with poles abutting at a transducing gap plane to define a transducing gap therebetween of a selected width and form a transducer face through which transducing flux flows for interaction with said magnetic record medium;
each of said core portions having a plurality of stacked magnetic laminations separated from one another by non-magnetic electrically conductive laminations;
an electrically conductive drive line extending a distance across each of said core portions in the direction of the width of the transducing gap at a selected distance from said transducing gap plane and said transducer face, respectively, said conductive drive line being conductively connected to said conductive laminations; and
means coupled to said conductive laminations of each of said core portions to selectively apply respective control currents to said conductive laminations to differentially saturate said magnetic laminations.

37. The magnetic transducer of claim 36 further including means for sequentially applying respective control currents to said conductive laminations of each core portion in ordered succession along the width of the transducing gap with the order of succession in one core portion opposite the order of succession in the other of said two core portions, to obtain in succession said differential saturation of portions of selected magnetic laminations.

38. The magnetic transducer of claim 37, wherein said means for sequentially applying respective control currents includes for each of said core portions, a control current source having one pole coupled to one end of said conductive drive line and switch means for selectively connecting each conductive lamination to another, opposite pole of said current source.

39. The magnetic transducer of claim 38 wherein said switch means is coupled to sequentially connect adjacent conductive laminations of one core portion in one direction to the current source while sequentially disconnecting adjacent conductive laminations of the other core portion in said direction from the current source.

40. An electromagnetically controlled magnetic transducer for transferring information to or from a magnetic record medium, comprising:
- a magnetic core having two confronting core portions with poles abutting at a transducing gap plane to define a transducing gap therebetwen of a selected width and form a transducer face through which transducing flux flows for interaction with said magnetic record medium;
- each of said confronting core portions having a plurality of stacked magnetic laminations separated from one another by non-magnetic, electrically conductive laminations;
- first and second control windings, each of which comprises an electrically conductive drive line extending a distance across an associated one of said core portions in the direction of the width of the transducing gap at selected distances from said transducing gap plane and said transducer face, said drive line being conductively connected with said conductive laminations for selectively saturating a portion of each of said magnetic lamination adjacent said transducing gap;
- means for sequentially applying respective control currents to said conductive laminations of each confronting core portion in an order succession along the width of the transducing gap with the order of succession in one core portion opposite the order of succession in the other core portion to obtain in succession said saturation of portions of selected magnetic laminations and wherein;
- at least one magnetic lamination portion of each core portion is unsaturated and is opposite at said transducing gap another unsaturated magnetic lamination portion of the other core portion to provide a highly permeable signal transfer zone.

41. A magnetically controlled transducer for transferring information between a signal winding and a magnetic record medium, comprising:
- a magnetic head having a pair of core portions separated by a non-magnetic transducing gap of defined width, each core portion having a magnetic reluctance gradient in a direction along the width of said gap, the reluctance gradient of one of said core portions being oriented in a direction opposite that of the other of said core portions, and said head having a pair of face portions respectively associated with said core portions through which transducing flux flows to or from the record medium;
- means for applying a control flux to one of said core portions to cause a region of the face portion associated with said core portion to be magnetically saturated and the remaining area of the face portion to be unsaturated and for applying a control flux to the other core portion to cause a region of the face portion associated with said other core portion to be magnetically saturated and the remaining area of the face portion to be unsaturated in a manner such that portions of the unsaturated areas of said two face portions lie adjacent one another in a direction transverse to the width of said gap to define a high permeability signal transfer zone through which transducing flux enters and exits said face portions.

42. The transducer of claim 41 wherein said reluctance gradients are defined in said core portions by respective wedge-shaped volumes of magnetic material in which said control fluxes flow, such that a portion of each wedge-shaped volume becomes magnetically saturated, which portion is proportional to the magnitude of the control flux flowing in said volume.

43. The transducer of claim 41 wherein said reluctance gradients are defined in said core portions by control windings extending through the respective core portions for applying said control fluxes, each control winding being disposed at an angle with respect to both the face portion associated with the respective core portion and to said gap.

44. The transducer of claim 41 wherein each of said core portions comprises a plurality of laminations stacked in a direction along the width of said gap, each of said laminations defining a successively longer path for the flow of control flux to thereby establish said reluctance gradient.

45. The transducer of claim 44 wherein said laminations of each core portion have depths gradually increasing from lamination to lamination across said transducer in the direction of the width of said transducing gap with the depths of the laminations of one core portion increasing in a direction opposite that of the laminations of the other core portion to provide said gradually increasing magnetic flux path reluctances.

46. The transducer of claim 44, wherein each lamination has a control winding window and a planar surface which defines part of one of said face portions and provides a control flux path having a substantially constant width defined by said control winding window.

47. A magnetic transducer that is controlled through selective magnetic saturation to transfer information between a signal winding and a record medium, comprising:
- a magnetic head having a pair of core portions separated by a non-magnetic transducing gap of defined width, said head having a pair of face portions respectively associated with said core portions through which transducing flux flows to or from the record medium;
- means for applying a control flux to one of said core portions to cause a region of the associated face portion extending from one end of said face portion to be magnetically saturated and the remaining area of the face portion to be unsaturated and for applying a control flux to the other core portion to cause a region of the face portion associated with said other portion extending from the opposite end of said face portion to be magnetically saturated and the remaining area of the other face portion to be unsaturated in a manner such that portions of the unsaturated areas of said two face portions lie adjacent one another in a direction transverse to the width of said gap to define a high permeability signal transfer zone through which transducing flux enters and exits said face portions.

48. The magnetically controlled transducer of claim 47 wherein each core portion has a magnetic reluctance gradient from one end to another in a direction along the width of said gap, the reluctance gradient of one of said core portions being oriented in a direction opposite that of the other of said core portions, and wherein the region at the end of each face portion which is magnetically saturated is adjacent the end of the associated core portion having the lower reluctance.

* * * * *